United States Patent
Ichikawa

(10) Patent No.: US 9,947,887 B2
(45) Date of Patent: Apr. 17, 2018

(54) DISPLAY UNIT, METHOD OF MANUFACTURING DISPLAY UNIT, AND ELECTRONIC APPARATUS

(71) Applicant: Sony Corporation, Tokyo (JP)

(72) Inventor: Tomoyoshi Ichikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/519,706

(22) Filed: Oct. 21, 2014

(65) Prior Publication Data

US 2015/0144906 A1 May 28, 2015

(30) Foreign Application Priority Data

Nov. 26, 2013 (JP) ................. 2013-244040

(51) Int. Cl.
*H01L 51/52* (2006.01)
*H01L 51/50* (2006.01)
*H01L 27/32* (2006.01)

(52) U.S. Cl.
CPC ...... *H01L 51/5228* (2013.01); *H01L 27/3246* (2013.01); *H01L 51/5076* (2013.01); *H01L 2227/323* (2013.01); *H01L 2251/5315* (2013.01)

(58) Field of Classification Search
CPC ......... H01L 2251/5315; H01L 27/3246; H01L 51/0021; H01L 51/5228; H01L 51/5076; H01L 2227/323
USPC ........................................ 313/503, 504, 506
See application file for complete search history.

(56) References Cited

U.S. PATENT DOCUMENTS

| | | | | |
|---|---|---|---|---|
| 7,423,374 B2* | 9/2008 | Okano | ............... | H01L 27/3246 313/504 |
| 7,994,708 B2* | 8/2011 | Choi | .................. | H01L 27/3276 313/504 |
| 8,698,177 B2* | 4/2014 | Lee | ..................... | H01L 51/5228 257/98 |
| 2003/0230980 A1* | 12/2003 | Forrest | ............... | H01L 51/5016 313/600 |
| 2006/0019573 A1* | 1/2006 | Koo | .................... | H01L 27/3244 445/24 |
| 2006/0113900 A1* | 6/2006 | Oh | ...................... | H01L 27/3276 313/504 |
| 2008/0284323 A1* | 11/2008 | Kashiwabara | ...... | H01L 51/5203 313/504 |
| 2009/0079336 A1* | 3/2009 | Yamada | ............. | H01L 51/5265 313/504 |
| 2009/0123720 A1* | 5/2009 | Chen | ................... | C07F 15/0033 428/220 |
| 2010/0015424 A1* | 1/2010 | Seo | ..................... | H01L 51/0013 428/216 |
| 2010/0156273 A1* | 6/2010 | Utsunomiya | ....... | H01L 27/3276 313/498 |

(Continued)

FOREIGN PATENT DOCUMENTS

JP 2013-054979 A 3/2013

*Primary Examiner* — Donald Raleigh
(74) *Attorney, Agent, or Firm* — Michael Best & Friedrich LLP

(57) ABSTRACT

A display unit includes: an organic light emitting element including a first electrode, an organic layer, and a second electrode in order, the organic layer including a conductive layer; and an auxiliary electrode configured to be electrically connected to the second electrode via the conductive layer in the organic layer.

18 Claims, 22 Drawing Sheets

(56) References Cited

U.S. PATENT DOCUMENTS

| | | | |
|---|---|---|---|
| 2012/0119235 A1* | 5/2012 | Nishiyama | H05B 33/10 257/88 |
| 2012/0268002 A1* | 10/2012 | Osako | H01L 27/3258 313/504 |
| 2013/0328039 A1* | 12/2013 | Ohuchi | H01L 27/3244 257/40 |
| 2014/0036189 A1* | 2/2014 | Yi | G02F 1/133512 349/43 |
| 2014/0299867 A1* | 10/2014 | Ono | H01L 51/5228 257/40 |
| 2014/0367651 A1* | 12/2014 | Song | H01L 51/5228 257/40 |
| 2015/0021560 A1* | 1/2015 | Jeong | H01L 51/56 257/40 |
| 2016/0043325 A1* | 2/2016 | Gorohmaru | H01L 51/0061 257/40 |

\* cited by examiner

DISPLAY UNIT, METHOD OF MANUFACTURING DISPLAY UNIT, AND ELECTRONIC APPARATUS

CROSS REFERENCE TO RELATED APPLICATION

This application claims the benefit of Japanese Priority Patent Application JP2013-244040 filed Nov. 26, 2013, the entire contents of which are incorporated herein by reference.

BACKGROUND

The present technology relates to a display unit that includes an organic light emitting element, to a method of manufacturing the display unit, and to an electronic apparatus.

In recent years, a size of a display has been increased, and lower power consumption thereof has been demanded accordingly. For example, this has been similarly demanded for an organic EL (electroluminescence) display unit of an active matrix drive scheme. An organic light emitting element includes an organic layer between a first electrode and a second electrode, and the organic layer includes a light emitting layer. In a top-emission-type display unit, the second electrode in the organic light emitting element is shared by all of the light emitting elements therein, and is made of a transparent (light transmissive) or semitransparent material. Further, a thickness of the second electrode is reduced in order to improve light extraction efficiency. For this reason, a resistance value of the second electrode is increased, and display quality is likely to be lowered due to voltage drop.

Accordingly, there has been proposed a method of forming an auxiliary electrode having a low resistance, and electrically connecting the second electrode to the auxiliary electrode (for example, Japanese Unexamined Patent Application Publication No. 2013-54979). The auxiliary electrode is provided, for example, on a drive substrate to be away from the first electrode in the organic light emitting element, and is covered with an insulating film (an inter-pixel insulating film). The auxiliary electrode is in contact with the second electrode at an opening of the insulating film, which results in electric connection between the auxiliary electrode and the second electrode.

SUMMARY

It may be difficult to form a second electrode having a small thickness at an opening portion in an insulating film (a portion having a level difference in thickness of the insulating film) so that the second electrode has a uniform thickness. For this reason, the second electrode is likely to be discontinuous at the opening portion in the insulating film. Discontinuation of the second electrode prevents electric connection between the second electrode and an auxiliary electrode from being maintained, which results in decrease in yield.

It is desirable to provide a display unit, a method of manufacturing the display unit, and an electronic apparatus that achieve high yields.

According to an embodiment of the present technology, there is provided a display unit including: an organic light emitting element including a first electrode, an organic layer, and a second electrode in order, the organic layer including a conductive layer; and an auxiliary electrode configured to be electrically connected to the second electrode via the conductive layer in the organic layer.

According to an embodiment of the present technology, there is provided an electronic apparatus provided with a display unit, the display unit including: an organic light emitting element including a first electrode, an organic layer, and a second electrode in order, the organic layer including a conductive layer; and an auxiliary electrode configured to be electrically connected to the second electrode via the conductive layer in the organic layer.

According to an embodiment of the present technology, there is provided a method of manufacturing a display unit, the method including: forming an auxiliary electrode and forming an organic light emitting element away from the auxiliary electrode, the organic light emitting element being provided with a first electrode, an organic layer, and a second electrode in order, and the organic layer including a conductive layer; and electrically connecting the second electrode to the auxiliary electrode via the conductive layer in the organic layer.

In the display unit, the method of manufacturing the display unit, or the electronic apparatus according to the embodiment of the present technology, the auxiliary electrode is electrically connected to the second electrode via the conductive layer. As a result, electric connection between the auxiliary electrode and the second electrode is maintained due to the conductive layer even if part of the second electrode has become discontinuous.

According to the display unit, the method of manufacturing the display unit, and the electronic apparatus of the embodiments of the present technology, the auxiliary electrode is electrically connected to the second electrode via the conductive layer, which improves stability of electric connection between the auxiliary electrode and the second electrode. As a result, defective connection between the auxiliary electrode and the second electrode is reduced, and yield is improved. It is to be noted that effects of the present technology are not necessarily limited to the effects described above, and may be any effect described herein.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments of the present technology are described below in detail with reference to the drawings. The description is provided in the following order.
1. First Embodiment (An example that has a light emitting layer for each organic light emitting element)
2. Second Embodiment (An example that has a light emitting layer shared by all of organic light emitting elements)
3. Third Embodiment (An example in which an auxiliary electrode is covered with a shielding member)

First Embodiment

[General Configuration of Display Unit 1]

Figure 1:
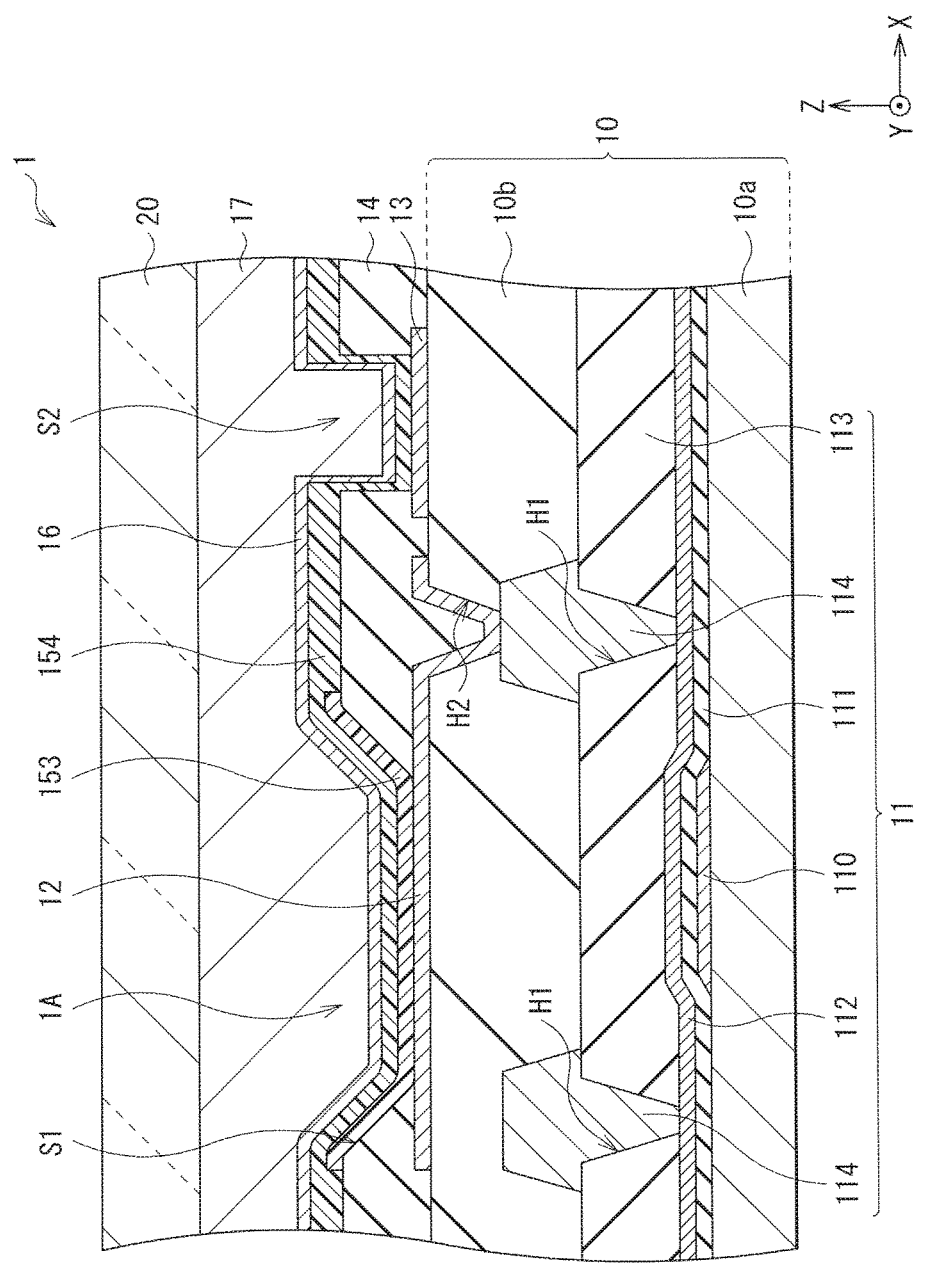
FIG. 1 is a cross-sectional view illustrating a configuration of a main part of a display unit according to a first embodiment of the present technology.

FIG. 1 illustrates a cross-sectional configuration of a main part of an organic EL display unit (a display unit 1) according to a first embodiment of the present technology. The display unit 1 may include a plurality of organic light emitting elements 1A on a drive substrate 10, and the drive substrate 10 faces a sealing substrate 20 with the organic light emitting elements 1A in between. The display unit 1 may be a so-called top-emission-type display unit in which light emitted by the organic light emitting elements 1A is extracted from the sealing substrate 20. Each of the organic light emitting elements 1A may configure, for example, one of three sub-pixels (pixels PXLC illustrated in FIG. 2 described later) of red (R), green (G), and blue (B). The three sub-pixels of R, G, and B serve as one pixel. An auxiliary electrode 13 is provided, together with the organic light emitting elements 1A, on the drive substrate 10.

Figure 2:
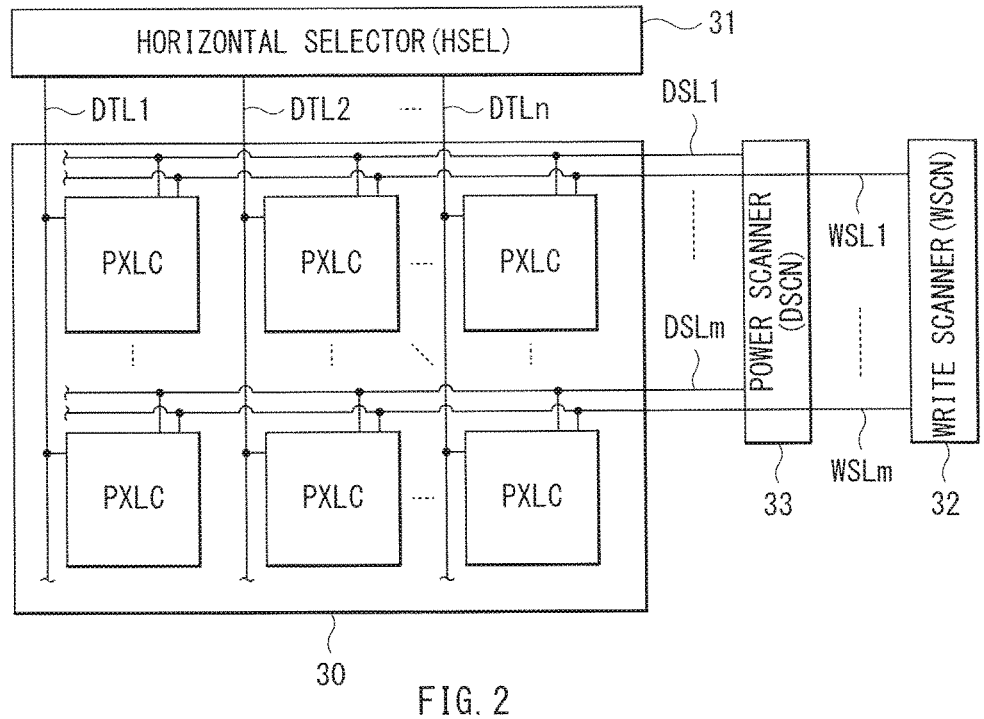
FIG. 2 is a diagram illustrating a general configuration of the display unit illustrated in FIG. 1.

FIG. 2 illustrates a general configuration of the display unit 1. As illustrated in FIG. 2, for example, on the drive substrate 10, a display region 30 may be formed in which the plurality of pixels PXLC (sub-pixels) including the organic light emitting elements 1A (FIG. 1) are arranged in a matrix, and a horizontal selector (HSEL) 31 serving as a signal line drive circuit, a write scanner (WSCN) 32 serving as a scanning line drive circuit, and a power scanner (DSCN) 33 serving as a power line drive circuit may be provided around the display region 30.

In the display region 30, a plurality of (n-number of) signal lines DTL1 to DTLn are arranged in a column direction where n is an integer, and a plurality of (m-number of) scanning lines WSL1 to WSLm and a plurality of (m-number of) power lines DSL1 to DSLm are arranged in a row direction where m is an integer. Each of the pixels PXLC (one of the pixels corresponding to R, G, and B) is provided at an intersection of each of the signal lines DTL and each of the scanning lines WSL. Each of the signal lines DTL is connected to the horizontal selector 31, and a picture signal is supplied from the horizontal selector 31 to each of the signal lines DTL. Each of the scanning lines WSL is connected to the write scanner 32, and a scanning signal (a selective pulse) is supplied from the write scanner 32 to each of the scanning lines WSL. Each of the power lines DSL is connected to the power scanner 33, and a power signal (a control pulse) is supplied from the power scanner 33 to each of the power lines DSL.

Figure 3:
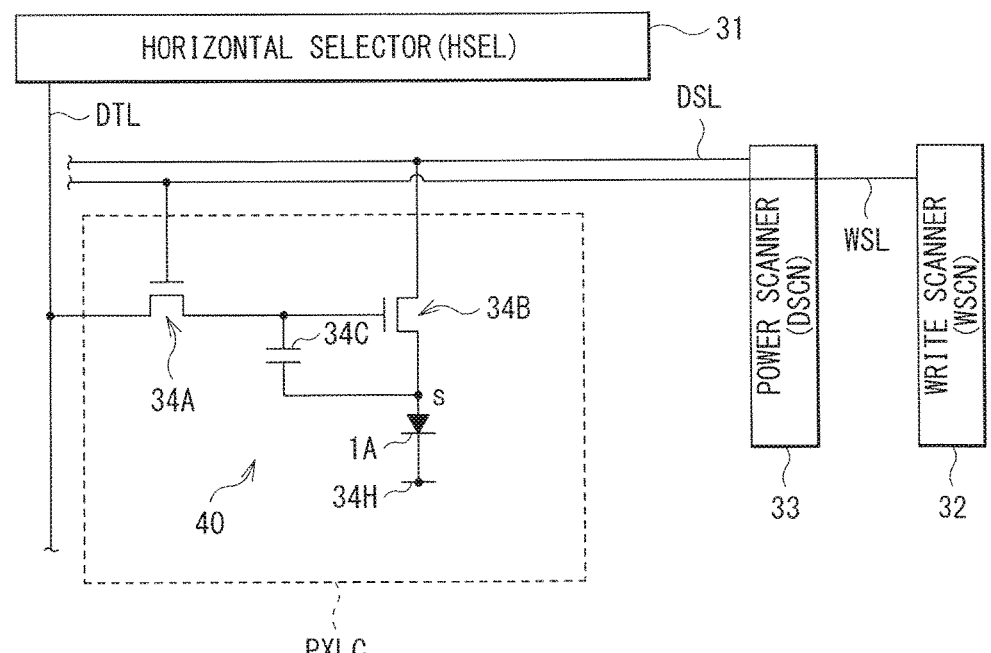
FIG. 3 is a diagram illustrating an example of a drive circuit of a pixel illustrated in FIG. 2.

FIG. 3 illustrates a specific circuit configuration example in the pixel PXLC. Each of the pixels PXLC includes a pixel circuit 40 that includes the organic light emitting element 1A. The pixel circuit 40 is an active drive circuit that includes a sampling transistor 34A, a drive transistor 34B, a retention capacitor 34C, and the organic light emitting element 1A.

A gate of the sampling transistor 34A is connected to a corresponding scanning line WSL. One of a source and a drain thereof is connected to a corresponding signal line DTL, and the other thereof is connected to a gate of the drive transistor 34B. A drain of the drive transistor 34B is connected to a corresponding power line DSL, and a source thereof is connected to an anode of the organic light emitting element 1A. A cathode of the organic light emitting element 1A is connected to a grounding line 34H. It is to be noted that the grounding line 34H is wired to be shared by all of the pixels PXLC. The retention capacitor 34C is arranged between the source and the gate of the drive transistor 34B.

The sampling transistor 34A becomes conductive in response to the scanning signal (the selective pulse) supplied from the scanning line WSL. The sampling transistor 34A thereby samples a signal potential of the picture signal supplied from the signal line DTL, and retains the sampled signal potential in the retention capacitor 34C. The drive transistor 34B receives a current supplied from the power line DSL set to a predetermined first potential (not illustrated), and supplies a drive current to the organic light emitting element 1A in accordance with a signal potential retained by the retention capacitor 34C. The organic light emitting element 1A emits light at luminance in accordance with the signal potential of the picture signal in response to the drive current supplied from the drive transistor 34B.

In such a circuit configuration, the sampling transistor 34A becomes conductive in response to the scanning signal (the selective pulse) supplied from the scanning line WSL, which causes the signal potential of the picture signal supplied from the signal line DTL to be sampled and retained in the retention capacitor 34C. Further, a current is supplied from the power line DSL set at the foregoing first potential to the drive transistor 34B, and the drive current is supplied to the organic light emitting element 1A in accordance with the signal potential retained in the retention capacitor 34C. Further, each of the organic light emitting elements 1A emits light at the luminance in accordance with the signal potential of the picture signal in response to the supplied drive current. Thus, picture is displayed based on the picture signal in the display unit 1.

[Main Part Configuration of Display Unit 1]

Next, referring again to FIG. 1, description is provided of detailed configuration of the drive substrate 10, the organic light emitting element 1A, the sealing substrate 20, etc.

The drive substrate 10 includes a drive circuit (a pixel circuit 40) on a substrate 10a. The drive circuit (the pixel circuit 40) includes a TFT 11.

The substrate 10a may be formed, for example, of glass, a plastic material, or the like that is capable of blocking transmission of moisture (water vapor) and oxygen. The substrate 10a is a supporting member that has one main surface provided with organic light emitting elements 1A arranged thereon. Examples of the material configuring the substrate 10a may include a glass substrate, a quartz substrate, and a silicon substrate. The glass substrate may be made of a material such as high-strain-point glass, soda glass ($Na_2O.CaO.SiO_2$), borosilicate glass ($Na_2O.B_2O_3.SiO_2$), forsterite ($2MgO.SiO_2$), or lead glass ($Na_2O.PbO.SiO_2$). The substrate 10a may be configured by providing an insulating film on a surface of such a glass substrate, quartz substrate, or silicon substrate. A metal foil, a film or a sheet made of resin, or the like may be also used as the substrate 10a. Examples of the material of the resin may include organic polymers such as polymethyl methacrylate (PMMA), polyvinyl alcohol (PVA), polyvinyl phenol (PVP), polyether sulfone (PES), polyimide, polycarbonate, polyethylene terephthalate (PET), and polyethylene naphthalate (PEN). It is to be noted that, because light is extracted from the sealing substrate 20 in the top emission type, the substrate 10a may be formed of either of a transmissive material or a non-transmissive material. The sealing substrate 20 may be made of a material same as that of the substrate 10a, or may be made of a material different therefrom. Alternatively, the substrate 10a may be made of a flexible material.

The TFT 11 may be, for example, a transistor corresponding to the foregoing sampling transistor 34A or the foregoing drive transistor 34B, and may serve as an active element of the organic light emitting element 1A. The TFT 11 may be configured to have an inverted staggered structure (a bottom gate type) or a staggered structure (a top gate type); however, description is provided here with the TFT 11 of a bottom gate type. The TFT 11 may include, for example, a gate electrode 110 in a selective region on the substrate 10a. A gate insulating film 111 is provided over an entire surface of the substrate 10a so as to cover the gate electrode 110 and the substrate 10a. A semiconductor layer 112 is formed on the gate insulating film 111. The semiconductor layer 112 serves as an active layer that forms a channel. The semiconductor layer 112 may be made, for example, of amorphous silicon, polycrystalline silicon, an oxide semiconductor, and/or the like. An interlayer insulating film 113 provided with a through hole (a contact hole H1) is formed on the semiconductor layer 112. A source-drain electrode 114 that serves as a source or a drain is provided on the interlayer insulating film 113 so as to fill the contact hole H1. The TFT 11 is covered with a planarization film 10b on the drive substrate 10.

The planarization film 10b is for planarizing the surface, of the substrate 10a, on which the TFT 11 is formed. The planarization film 10b may be configured, for example, of an organic insulating film made of a material such as polyimide, acrylic resin, or novolac resin. Alternatively, the planarization film 10b may be configured, for example, of an inorganic insulating film. The inorganic insulating film may be, for example, a single-layer film or a laminated film that includes one or more of silicon oxide ($SiO_x$), silicon nitride ($SiN_x$), silicon oxynitride (SiON), and the like. The planarization film 10b includes a contact hole H2. The TFT 11 (the source-drain electrode 114) is electrically connected to a first electrode 12 described later via the contact hole H2.

The organic light emitting element 1A is provided on the planarization film 10b. The organic light emitting element 1A includes the first electrode 12, an organic layer (an organic layer 15 illustrated in FIG. 4 described later), and a second electrode 16 in order from the planarization film 10b (the drive substrate 10).

The first electrodes 12 are provided on the planarization film 10b to be away from one another, for example, for the respective organic light emitting elements 1A. The first electrode 12 may serve, for example, as an anode electrode and a reflection layer, and may be desirably made of a material that has high reflectance and high hole injection characteristics. Such a first electrode 12 may have, for example, a thickness in a lamination direction (hereinafter, simply referred to as "thickness") from about 100 nm to about 300 nm both inclusive, and may be made of a simple substance or alloy of a metal element such as chromium (Cr), gold (Au), platinum (Pt), nickel (Ni), copper (Cu), molybdenum (Mo), tungsten (W), titanium (Ti), tantalum (Ta), aluminum (Al), iron (Fe), or silver (Ag). The first electrode 12 may be configured of a lamination of a plurality of such metal films. Alternatively, the first electrode 12 may be made of Al-neodymium (Nd) alloy, or Ag—Pd—Cu alloy in which palladium (Pd) from about 0.3 wt % to about 1 wt % and copper from about 0.3 wt % to about 1 wt % are contained in silver. The first electrode 12 may be preferably made of a material having a high work function. However, even metal having a low work function such as aluminum or aluminum alloy may be used as the first electrode 12 by selecting the appropriate organic layer 15 (in particular, a hole injection layer 151 described later). The first electrode 12 may be made of a conductive material having high light transmission characteristics, and a reflection layer may be provided between the substrate 10a and the first electrode 12.

An inter-pixel insulating film 14 (an insulating film) may be provided between the first electrode 12 and the organic layer 15. The inter-pixel insulating film 14 electrically separates the adjacent organic light emitting elements 1A, and secures insulation between the first electrode 12 and the second electrode 16. The inter-pixel insulating film 14 may be provided with an opening S1 (a first opening), and the organic layer 15 is in contact with a surface, of the first electrode 12, that is exposed from the opening S1. In other words, a shape of a light emitting region of the organic light emitting element 1A is controlled by the inter-pixel insulating film 14. The opening S1 has a wall surface that is sloped with respect to the surface of the first electrode 12. A size of the opening S1 may be preferably increased from a position closer to the drive substrate 10 toward the sealing substrate 20. In other words, the inter-pixel insulating film 14 may preferably include the opening S1 of a forward tapered shape. This increases the light extraction efficiency of the organic light emitting element 1A. The inter-pixel insulating film 14 may be configured, for example, of an organic insulating film made of a material such as polyimide, acrylic resin, and novolac resin. The organic insulating film may be preferably photosensitive. The inter-pixel insulating film 14 may be provided, for example, over the entire surface of the substrate 10a.

The organic layer 15 may include a light emitting layer 153 and an electron transfer layer 154 (a conductive layer). The light emitting layer 153 may be separated, for example, between the adjacent organic light emitting elements 1A. For each of the organic light emitting elements 1A, one of the light emitting layer 153 that emits red light, the light emitting layer 153 that emits green light, and the light emitting layer 153 that emits blue light may be provided.

The light emitting layer 153 that emits red light may be configured, for example, of 8-quinolinol aluminum complex ($Alq_3$) mixed with 40 vol % of 2,6-bis[4-[N-(4-methoxyphenyl)-N-phenyl]aminostyryl]naphthalene-1,5-dicarbonitril (BSN—BCN). The light emitting layer 153 that emits green light may be configured, for example, of $Alq_3$ mixed with 3 vol % of Coumarin6. The light emitting layer 153 that emits blue light may be configured, for example, of spiro6Φ. The light emitting layer 153 may have a thickness, for example, from about 5 nm to about 50 nm.

The electron transfer layer 154 may be shared, for example, by all of the organic light emitting elements 1A. In the present embodiment, the electron transfer layer 154 has conductivity, and the second electrode 16 of the organic light emitting element 1A is electrically connected to the auxiliary electrode 13 via the electron transfer layer 154. Thus, stability of electric connection between the auxiliary electrode 13 and the second electrode 16 is thereby improved, which is described later in detail.

The electron transfer layer 154 may be made, for example, of an organic material to which alkali metal or alkaline-earth metal is added (doped). Examples of the organic material may include BCP (2,9-dimethyl-4,7-diphenyl-1,10-phenanthroline), $Alq_3$ (quinolinol aluminum), and Bphen (bathophenanthroline). In the electron transfer layer 154, such an organic material as a host material may be doped, for example, with about 0.5 wt % to about 15 wt % of alkali metal such as lithium (Li), sodium (Na), potassium (K), rubidium (Rb), and cesium (Cs), or of alkaline-earth metal such as magnesium (Mg), calcium (Ca), strontium (Sr), and barium (Ba).

Such an electron transfer layer 154 is provided between the light emitting layer 153 and the second electrode 16. The electron transfer layer 154 configures the organic light emitting element 1A at the opening S1 in the inter-pixel insulating film 14. Also, the electron transfer layer 154 continuously extends to a region that does not face the light emitting layer 153 or the first electrode 12, and is in contact with the auxiliary electrode 13. In the organic light emitting element 1A, the electron transfer layer 154 is in contact with both of the light emitting layer 153 and the second electrode 16. The electron transfer layer 154 may have a thickness, for example, from about 10 nm to about 200 nm.

Figure 4:
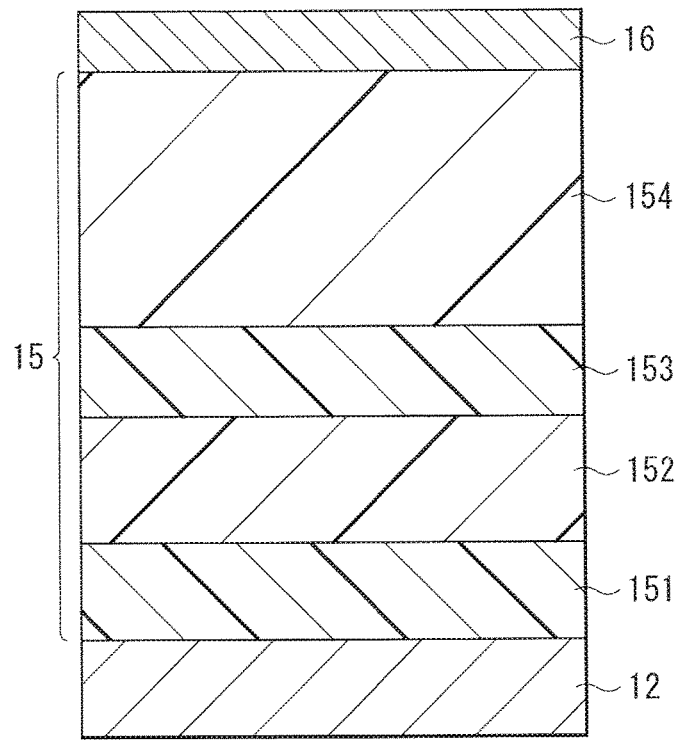
FIG. 4 is a cross-sectional view illustrating an example of a configuration of an organic layer that includes a light emitting layer and an electron transfer layer illustrated in FIG. 1.

The organic layer 15 may include other layer together with the light emitting layer 153 and the electron transfer layer 154. FIG. 4 illustrates an example of a configuration of the organic layer 15. The organic layer 15 may include, for example, the hole injection layer 151, a hole transfer layer 152, the light emitting layer 153, the electron transfer layer 154, and the second electrode 16 in order on the first electrode 12. An electron injection layer (not illustrated) may be provided between the electron transfer layer 154 and the second electrode 16. The hole injection layer 151, the hole transfer layer 152, and the electron injection layer may be separated between the adjacent organic light emitting elements 1A as with the light emitting layer 153, for example.

The hole injection layer 151 is for increasing hole injection efficiency, and serves as a buffer layer for preventing leakage of current. The hole injection layer 151 may be made, for example, of 4,4', 4"-tris (3-methylphenylphenylamino)triphenylamine (m-MTDATA), 4,4',4"-tris (2-naphthylphenylamino)triphenylamine (2-TNATA), bis [(N-naphthyl)-N-phenyl]benzidine (α-NPD), poly (3-hexylthiophene) (P3HT), poly (3,4-ethylenedioxythiophene): poly (styrenesulfonate) (PEDOT-PSS), or hexaazatriphenylene (HAT).

The hole transfer layer 152 is for increasing efficiency in hole transfer to the light emitting layer 153. The hole transfer layer 152 may be made, for example, of α-NPD. The hole transfer layer 152 may have a thickness, for example, from about 10 nm to about 200 nm.

The electron injection layer is for increasing electron injection from the second electrode 16. The electron injection layer may be configured, for example, of lithium fluoride (LiF), or the like.

The second electrode 16 forms a pair together with the first electrode 12 with the organic layer 15 in between. Also, the second electrode 16 is provided on the electron transfer layer 154 to be shared by all of the organic light emitting elements 1A. The second electrode 16 may serve as a cathode electrode and may serve as a light transmission layer, for example. The second electrode 16 may be desirably made of a material that has high conductivity and high light transmittance. Accordingly, the second electrode 16 may be made, for example, of alloy of aluminum (Al), magnesium (Mg), silver (Ag), calcium (Ca), or sodium (Na). In particular, alloy (Mg—Ag alloy) of magnesium and silver may be preferable, because the Mg—Ag alloy has both conductivity and small absorption in a form of a thin film. A ratio of magnesium and silver in the Mg—Ag alloy is not particularly limited, but may be desirably in a range of Mg:Ag=from 20:1 to 1:1 in thickness ratio. Further, examples of a material configuring the second electrode 16 may include alloy (Al—Li alloy) of aluminum (Al) and lithium (Li), indium-tin oxide (ITO), zinc oxide (ZnO), alumina-doped zinc oxide (AZO), gallium-doped zinc oxide (GZO), indium-zinc oxide (IZO), indium-titanium oxide (ITiO), and indium-tungsten oxide (IWO). The second electrode 16 may be configured of a lamination of a plurality of films. For example, the second electrode 16 may be configured by laminating a film made of magnesium, silver, or alloy including magnesium or silver on a film made of calcium, barium (Ba), lithium, cesium (Cs), indium (In), magnesium, silver, or the like. The second electrode 16 may have a thickness, for example, from about 3 nm to about 15 nm.

The second electrode 16 extends, together with the electron transfer layer 154, to a region that does not face the light emitting layer 153 and the first electrode 12 of the organic light emitting element 1A. The second electrode 16 faces the auxiliary electrode 13 with the electron transfer layer 154 in between. The second electrode 16 is in contact with the electron transfer layer 154.

Figure 5:
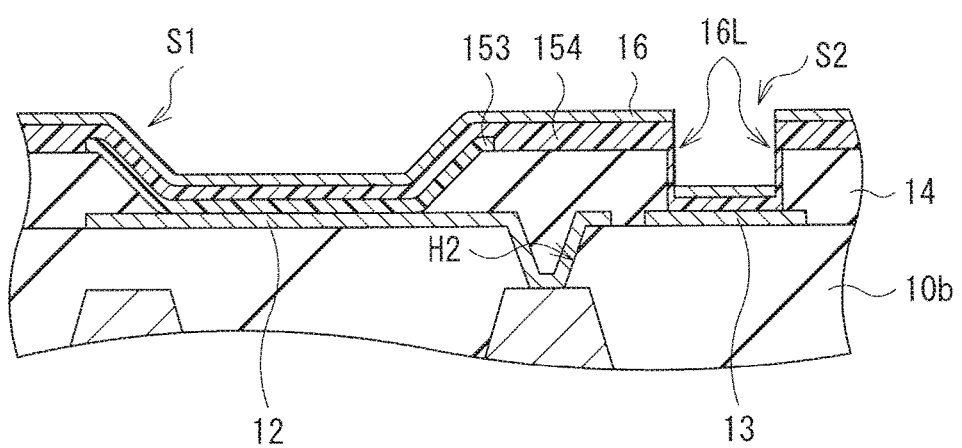
FIG. 5 is a cross-sectional view illustrating another example of a second electrode illustrated in FIG. 1.

As illustrated in FIG. 5, part of the second electrode 16 may be separated (may be discontinuous) near the auxiliary electrode 13 (a separation portion 16L). Even when the separation portion 16L is present in the second electrode 16, the second electrode 16 is electrically connected to the auxiliary electrode 13 via the electron transfer layer 154, because the electron transfer layer 154 continuously extends from the opening S1 in the inter-pixel insulating film 14 to the auxiliary electrode 13.

A protection layer 17 may be provided on the second electrode 16. The protection layer 17 is for preventing intrusion of moisture into the organic layer 15, and for increasing mechanical strength of the display unit 1. The protection layer 17 may be made of a material that has high light transmission characteristics and low water permeability. The protection layer 17 may have a thickness, for example, from about 1 μm to about 8 μm. The protection layer 17 may be made of either of an insulating material and a conductive material. The protection layer 17 may be made, for example, of silicon nitride ($SiN_x$), silicon oxide ($SiO_x$), aluminum oxide ($AlO_x$), or a combination thereof. The sealing substrate 20 may be attached on the protection layer 17 with the use of an adhesive layer (not illustrated).

The sealing substrate 20 is for sealing the respective light emitting elements 1A, together with the protection layer 17. The sealing substrate 20 may be made, for example, of a material transparent to light of respective colors of red, green, and blue. Examples of such a material may include glass. The sealing substrate 20 may be provided with a color filter (not illustrated). The color filter may include, for example, a red filter, a green filter, and a blue filter. The color filter may be made, for example, of a resin material in which a pigment or a dye is mixed.

The sealing substrate 20 may be provided with a light blocking film (not illustrated) as a black matrix. Thus, outside light reflected between the organic light emitting elements 1A (between the sub-pixels), by the wirings, etc. is absorbed, which results in improvement in contrast. The light blocking film may be configured, for example, of a resin film in which a black colorant is mixed, or a thin-film filter that utilizes interference of thin film.

In such a top-emission-type display unit, the second electrode 16 that has high light transmission characteristics is provided over a wide region on the drive substrate 10. Many of the conductive materials having light transmission characteristics have higher resistance compared to other conductive materials. Further, the second electrode 16 may be preferably thin (may preferably have a small thickness) in order to increase light extraction efficiency of the organic light emitting element 1A. Accordingly, the resistance of the second electrode 16 is increased, which makes voltage drop easier to be caused. The auxiliary electrode 13 is electrically connected to the second electrode 16, and is provided for suppressing such voltage drop. Provision of the auxiliary electrode 13 makes it possible to reduce consumed power.

Figure 6:
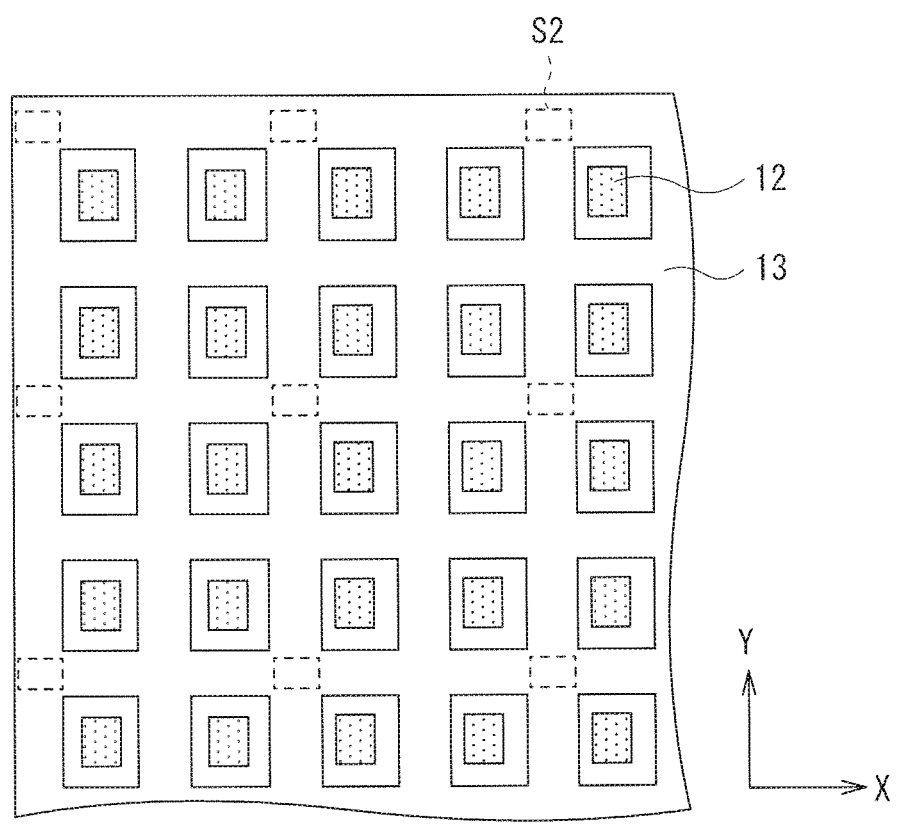
FIG. 6 is a planar view illustrating a configuration of an auxiliary electrode illustrated in FIG. 1.

FIG. 6 schematically illustrates a planar layout (a layout of an XY-plane parallel to the substrate surface) of the auxiliary electrode 13 and the first electrodes 12. The auxiliary electrode 13 may be provided, for example, around the first electrodes 12 and away from the first electrodes 12. The first electrodes 12 may be arranged, for example, in a matrix in correspondence with an arrangement of the pixels PXLC (FIG. 2). The auxiliary electrode 13 may have openings at formation regions of the first electrodes 12 and a region therearound. The auxiliary electrode 13 may have, for example, a lattice shape. The auxiliary electrode 13 may have any planar shape, and may have, for example, a strip shape that extends in only one of an X direction and a Y direction.

The auxiliary electrode 13 may be provided, for example, on the planarization film 10b, in a layer same with that of the first electrodes 12 (FIG. 1). The inter-pixel insulating film 14 is also provided on the auxiliary electrode 13, and the auxiliary electrode 13 is electrically insulated from the first electrode 12 by the inter-pixel insulating film 14. The inter-pixel insulating film 14 is provided with an opening S2 that causes the surface of the auxiliary electrode 13 to be exposed therefrom. The auxiliary electrode 13 is in contact, at the opening S2, with the electron transfer layer 154 extending from the formation region of the organic light emitting element 1A. At the opening S2, the second electrode 16 is laminated on the auxiliary electrode 13 with the electron transfer layer 154 in between. This causes the auxiliary electrode 13 to be electrically connected to the second electrode 16 via the electron transfer layer 154 as described above. A sidewall of the opening S2 may be, for example, almost perpendicular to the surface of the auxiliary electrode 13. The electron transfer layer 154 and the second electrode 16 are continuously provided from a region on the inter-layer insulating film 14 along the sidewall of the opening S2. A plurality of openings S2 may be arranged, for example, at positions that face the intersections of the lattice-shaped auxiliary electrode 13 (FIG. 6). The openings S2 may have any arrangement, and may extend in one or both of the X direction and the Y direction (not illustrated).

The auxiliary electrode 13 may be configured, for example, of a single-layer film or a laminated film that includes one or more of titanium (Ti), aluminum (Al), alloy (Al—Nd alloy) of aluminum and neodymium, indium-tin oxide (ITO), and indium-zinc oxide (IZO). The surface of the auxiliary electrode 13 may be preferably made of ITO in order to secure ohmic contact with the electron transfer layer 154. The auxiliary electrode 13 may be made of a material and a thickness same as those of the first electrode 12. The auxiliary electrode 13 may be electrically connected, for example, to the grounding line 34H (FIG. 3).

[Manufacturing Method]

The display unit 1 as described above may be manufactured as follows, for example (FIGS. 7A to 9B). It is to be noted that illustration of the hole injection layer 151 and the hole transfer layer 152 is omitted in FIGS. 7C to 9B.

First, the drive substrate 10 is prepared. Specifically, the drive circuit including the TFT 11 is formed on the substrate 10a made of the above-described material via a predetermined thin-film process. Thereafter, the planarization film 10b may be formed on the entire surface of the substrate 10a, for example, by a spin coating method or a slit coating method. Subsequently, the formed planarization film 10b may be patterned into a predetermined shape, for example, by a photolithography method, and the contact hole H2 is formed in the patterned planarization film 10b.

[First Electrode, Step of Forming Auxiliary Electrode]

Subsequently, the first electrode 12 and the auxiliary electrode 13 that are made of the above-described materials are formed on the drive substrate 10 in the same patterning step or in different patterning steps. For example, first, Al—Nd alloy may be deposited as the first electrode 12 on the entire surface of the substrate, for example, by a sputtering method. Subsequently, the deposited Al—Nd alloy may be patterned, for example, by etching using a photolithography method. At this time, part of the first electrode 12 is caused to fill the contact hole H2 in the planarization film 10b to electrically connect the first electrode 12 to the TFT 11. Thereafter, aluminum and ITO are respectively deposited in order as the auxiliary electrode 13 over the entire surface of the substrate by a sputtering method. Subsequently, the formed laminated film (ITO/Al) is patterned by etching using a photolithography method.

The first electrode 12 may be formed after forming the auxiliary electrode 13. A formation order of the first electrode 12 and the auxiliary electrode 13 may be appropriately set depending on the respective electrode materials. When the first electrode 12 and the auxiliary electrode 13 have the same lamination structure and are made of the same material, the first electrode 12 and the auxiliary electrode 13 may be patterned together in the same step.

[Step of Forming Inter-pixel Insulating Film]

Figure 7A:
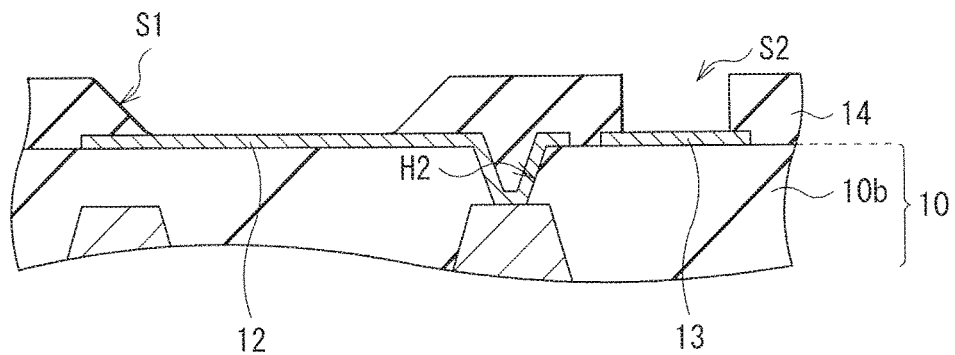
FIG. 7A is a cross-sectional view illustrating a manufacturing step of the display unit illustrated in FIG. 1.

After forming the first electrode 12 and the auxiliary electrode 13, the inter-pixel insulating film 14 may be formed on the drive substrate 10, for example, by a photolithography method as illustrated in FIG. 7A. Specifically, first, the above-described material of the inter-pixel insulating film 14 may be deposited over the entire surface of the drive substrate 10, for example, by a spin coating method or a slit coating method. At this time, a photosensitive resin material is used as a material of the inter-pixel insulating film 14. Subsequently, a selective region is exposed with the use of a predetermined photomask, which is subsequently developed to form the openings S1 and S2 in the inter-pixel insulating film 14.

[Step of Forming Organic Layer]

Figure 7B:
FIG. 7B is a cross-sectional view illustrating a step following the step illustrated in FIG. 7A.
Figure 7B:
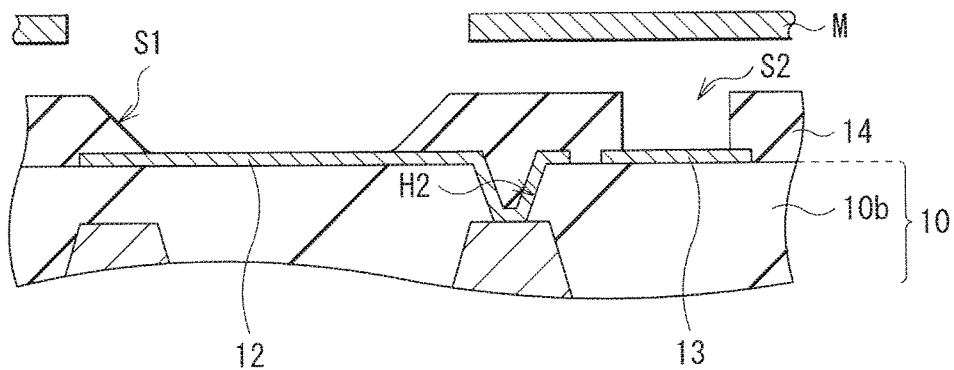
Figure 7C:
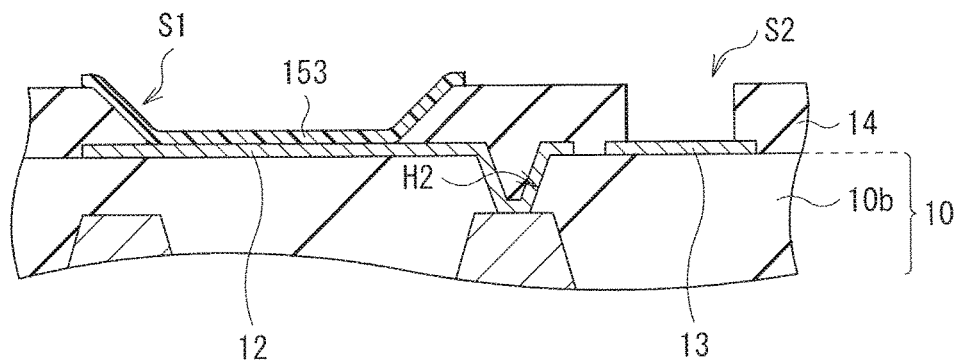
FIG. 7C is a cross-sectional view illustrating a step following the step illustrated in FIG. 7B.

Subsequently, the organic layer 15 is formed. The organic layer 15 may be formed by a vacuum deposition method, for example, in order of the hole injection layer 151, the hole transfer layer 152, the light emitting layer 153, and the electron transfer layer 154. As illustrated in FIG. 7B, first, for example, a deposition mask M that has an opening in a region facing each of the openings S1 in the inter-pixel insulating film 14 may be used to form the hole injection layer 151, the hole transfer layer 152, and the light emitting layer 153 in order (FIG. 7C). By thus using the deposition mask M, the hole injection layer 151, the hole transfer layer 152, and the light emitting layer 153 that are separated for each of the organic light emitting elements 1A are formed, and the hole injection layer 151, the hole transfer layer 152, and the light emitting layer 153 are prevented from being formed on the auxiliary electrode 13 (at the opening S2 in the inter-pixel insulating film 14).

Figure 8A:
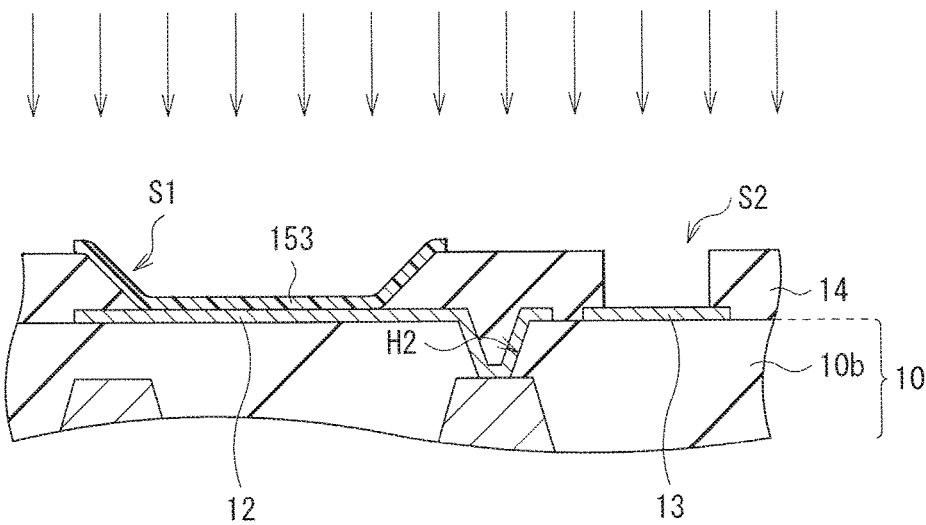
FIG. 8A is a cross-sectional view illustrating a step following the step illustrated in FIG. 7C.
Figure 8B:
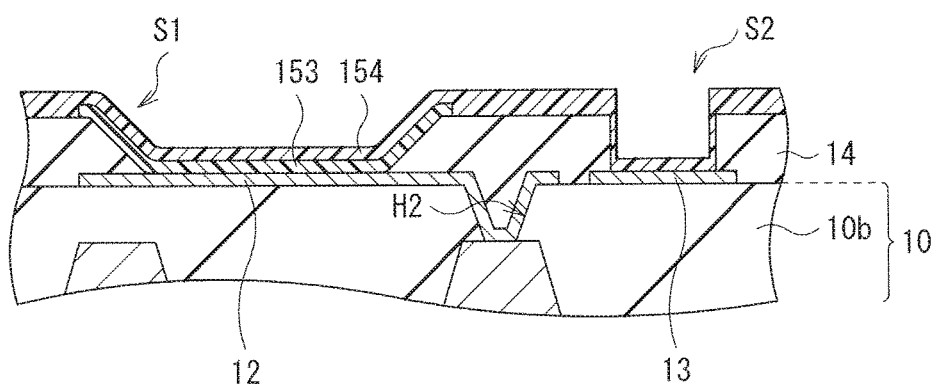
FIG. 8B is a cross-sectional view illustrating a step following the step illustrated in FIG. 8A.

After providing the light emitting layer 153, the mask M is removed, and the electron transfer layer 154 is formed on the entire surface of the drive substrate 10 (FIGS. 8A and 8B). At this time, the electron transfer layer 154 is formed so as to continuously cover from the opening S1 to the opening S2 in the inter-pixel insulating film 14 and to be in contact with the auxiliary electrode 13.

[Step of Forming Second Electrode]

Figure 9A:
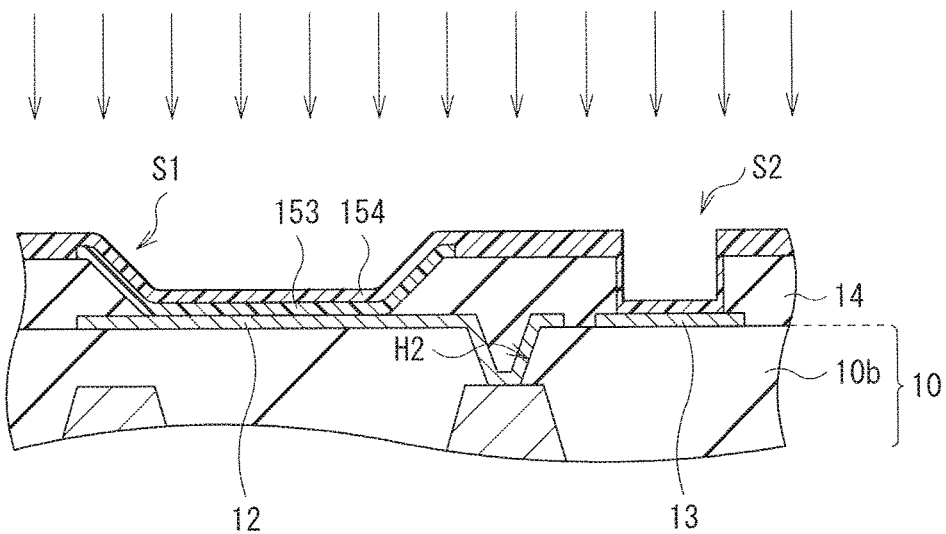
FIG. 9A is a cross-sectional view illustrating a step following the step illustrated in FIG. 8B.
Figure 9B:
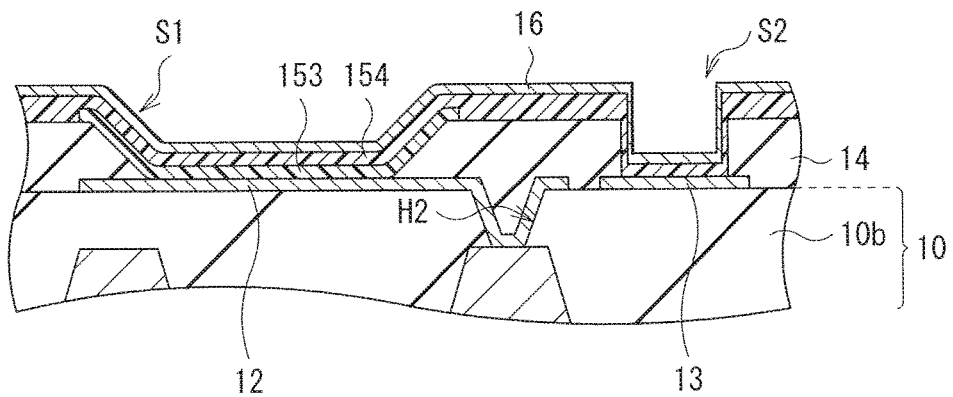
FIG. 9B is a cross-sectional view illustrating a step following the step illustrated in FIG. 9A.

Thereafter, as illustrated in FIGS. 9A and 9B, the second electrode 16 made of the above-described material may be formed on the entire surface of the drive substrate 10, for example, by a deposition method. Thus, the second electrode 16 is formed at the openings S1 and S2 in the inter-pixel insulating film 14 in a manner similar to that of the electron transfer layer 154. The second electrode 16 may be formed by a sputtering method.

Subsequently, the protection layer 17 made of the above-described material is formed so as to cover the entire surface on the second electrode 16. Thereafter, the drive substrate 10 is attached to the sealing substrate 20 with the use of an adhesive layer. Thus, the display unit 1 illustrated in FIG. 1 is completed.

[Functions and Effects]

In the display unit 1, when the drive current based on the picture signal is supplied to each of the sub-pixels (the organic light emitting elements 1A) via the first electrode 12 and the second electrode 16, light emission is caused as a result of recombination of a hole and an electron in the organic layer 15 (the light emitting layer 153) in each of the organic light emitting elements 1A. Light emitted toward the first electrode 12 (downward) out of the thus generated red light, green light, and blue light is reflected by the first electrode 12, etc., and then exits from an upper side of the sealing substrate 20. On the other hand, light emitted toward the second electrode 16 (upward) passes through the second electrode 16 as it is, and then exits from the upper side of the sealing substrate 20. Thus, full-color picture display of a top-emission scheme is performed.

In the display unit 1, the auxiliary electrode 13 is electrically connected to the second electrode 16 via the electron transfer layer 154, and stability of electric connection between the auxiliary electrode 13 and the second electrode 16 is therefore improved. This is described below.

Comparative Example

Figure 10:
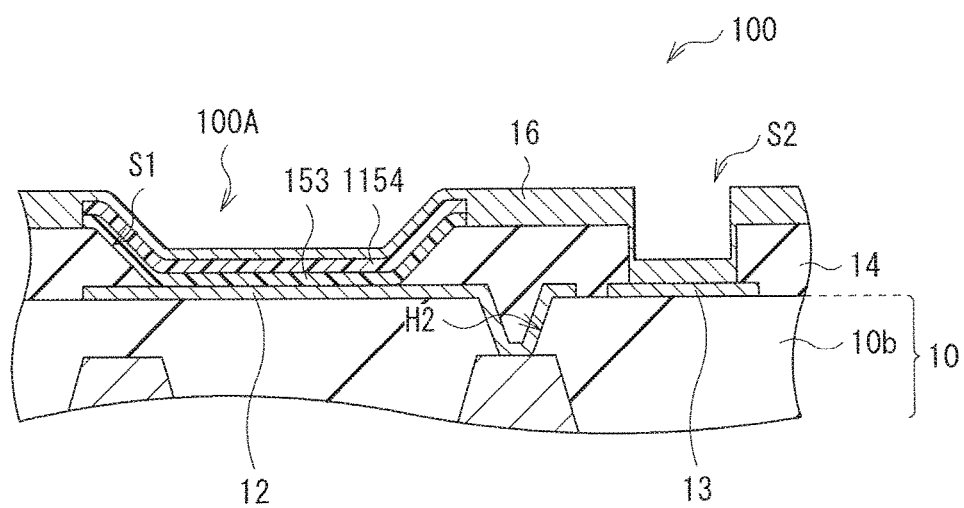
FIG. 10 is a cross-sectional view illustrating a configuration of a display unit according to a comparative example.
Figure 11:
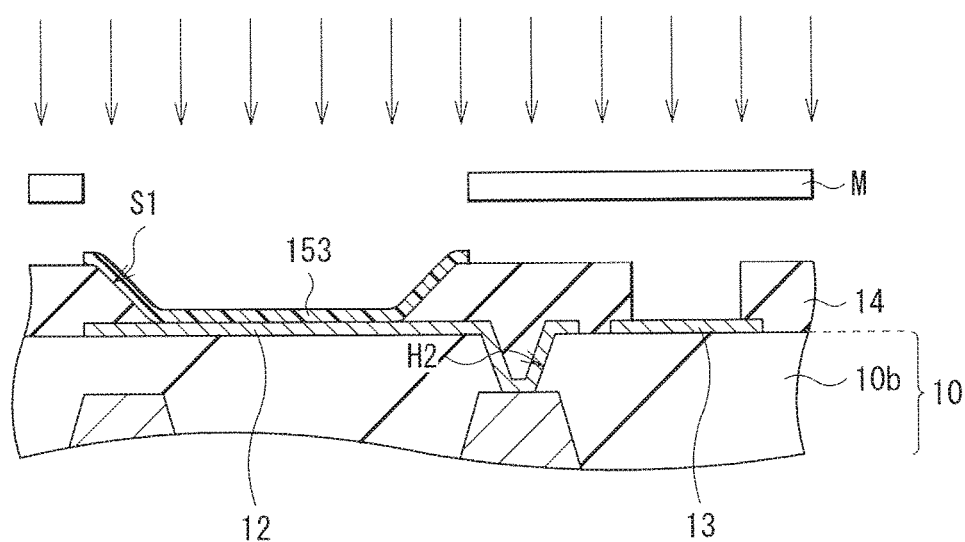
FIG. 11 is a cross-sectional view illustrating a manufacturing step of the display unit illustrated in FIG. 10.

FIG. 10 illustrates a cross-sectional configuration of a part of a display unit (a display unit 100) according to a comparative example. The display unit 100 is provided with the auxiliary electrode 13 as in the display unit 1. However, the auxiliary electrode 13 in the display unit 100 is in direct contact with the second electrode 16, and an electron transfer layer (an electron transfer layer 1154) is not provided between the auxiliary electrode 13 and the second electrode 16. In the display unit 100, the electron transfer layer 1154 may be formed, for example, with the use of the deposition mask M (FIG. 11) in a manner similar to that of the light emitting layer 153, and the electron transfer layer 1154 is provided only in a formation region of an organic light emitting element (an organic light emitting element 100A).

In the display unit 100 of a top-emission type, the thickness of the second electrode 16 is made smaller in order to suppress degradation in light extraction efficiency. Such a second electrode 16 may be difficult to be formed with a uniform thickness in a level-difference portion, etc. For example, such a second electrode 16 may not be formed with a uniform thickness along the sidewall of the opening S2 in the inter-pixel insulating film 14. In other words, the second electrode 16 is likely to be made discontinuous by the level difference caused by the opening S2 in the inter-pixel insulating film 14. When the second electrode 16 is made discontinuous between each of the organic light emitting elements 100A and the auxiliary electrode 13, voltage drop of the second electrode 16 is not allowed to be suppressed. That is, the auxiliary electrode 13 does not function, and display quality is therefore not allowed to be maintained, which results in decrease in yield.

In contrast, in the display unit 1, the conductive electron transfer layer 154 is provided over the entire surface of the display region 30 of the drive substrate 10, and continuously extends from the formation region of the organic light emitting element 1A to the region on the auxiliary electrode 13. At the opening S2 in the inter-pixel insulating film 14, the electron transfer layer 154 is present between the auxiliary electrode 13 and the second electrode 16. For this reason, even if part of the second electrode 16 becomes discontinuous, electric connection between the auxiliary electrode 13 and the second electrode 16 is maintained due to the electron transfer layer 154. Also in a case where part of the electron transfer layer 154 becomes discontinuous, the auxiliary electrode 13 is electrically connected to the second electrode 16 in a similar manner when the second electrode 16 is present at the discontinuous portion. Thus, stability of electric connection between the auxiliary electrode 13 and the second electrode 16 is improved.

It may be an option to increase the thickness of the second electrode 16 in order to prevent the second electrode 16 from being discontinuous. However, light extraction efficiency of the organic light emitting element is decreased in this case. By electrically connecting the auxiliary electrode 13 to the second electrode 16 via the electron transfer layer 154, it is possible to improve stability of the electric connection therebetween without decreasing the light extraction efficiency. Further, the thin second electrode 16 suppresses decrease in light emission efficiency. In addition thereto, freedom in design of the organic light emitting element 1A is also improved.

As described above, in the present embodiment, the auxiliary electrode 13 is electrically connected to the second electrode 16 via the conductive electron transfer layer 154, and defects in connection between the auxiliary electrode 13 and the second electrode 16 is therefore suppressed, which makes it possible to improve yield.

Other embodiments are described below. The same numerals are used to designate substantially the same components of the first embodiment, and the description thereof is appropriately omitted.

Second Embodiment

Figure 12:
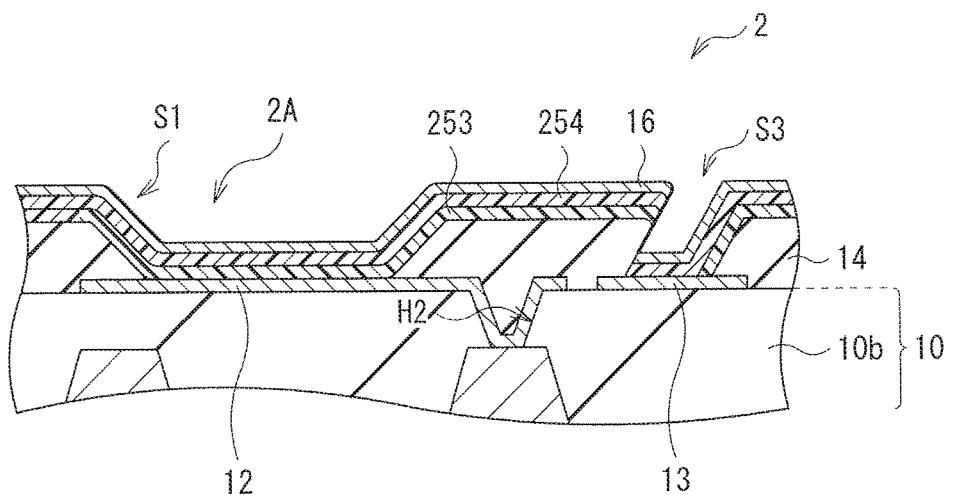
FIG. 12 is a cross-sectional view illustrating a configuration of a main part of a display unit according to a second embodiment of the present technology.

FIG. 12 illustrates a cross-sectional configuration of a main part of a display unit (a display unit 2) according to the second embodiment of the present technology. In the display unit 2, the auxiliary electrode 13 is in contact with an electron transfer layer 254 at an opening S3 in the inter-pixel insulating film 14. A sidewall of the opening S3 has surfaces (sloped surfaces 14A and 14B in FIG. 14 described later) that are sloped with respect to the surface of the auxiliary electrode 13. Except for this, the display unit 2 has a configuration similar to that of the display unit 1, and has functions and effects similar to those of the display unit 1.

The display unit 2 includes a plurality of organic light emitting elements 2A. Each of the organic light emitting elements 2A includes the first electrode 12, an organic layer (an organic layer 25 illustrated in FIG. 13 described later), and the second electrode 16 in order on the drive substrate 10, as with the organic light emitting element 1A.

Figure 13:
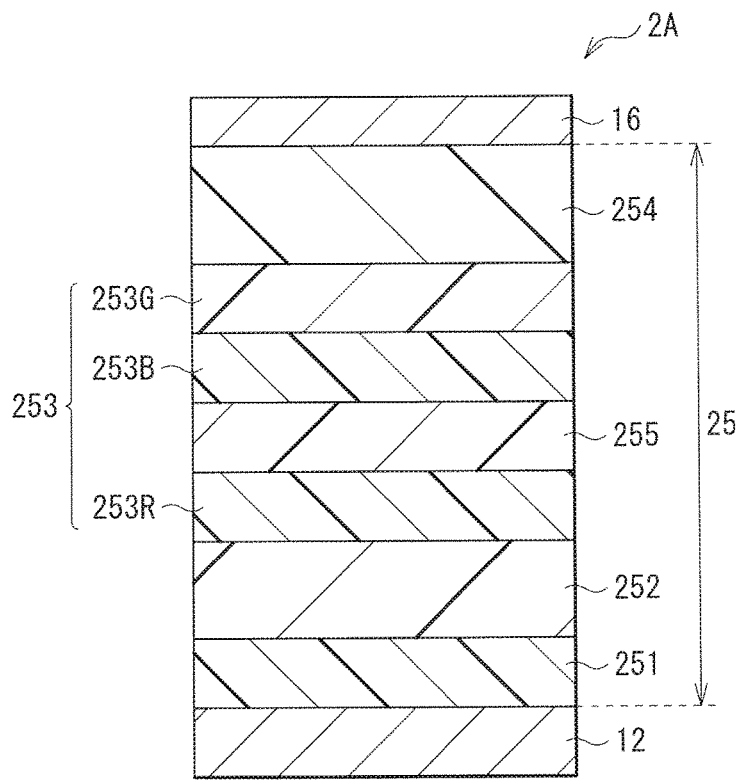
FIG. 13 is a cross-sectional view illustrating an example of a configuration of an organic layer that includes a light emitting layer and an electron transfer layer illustrated in FIG. 12.

As illustrated in FIG. 13, the organic layer 25 in the organic light emitting element 2A may include, for example, a hole injection layer 251, a hole transfer layer 252, a light emitting layer 253, and an electron transfer layer 254 in order on the first electrode 12. An electron injection layer (not illustrated) may be provided between the electron transfer layer 254 and the second electrode 16. The light emitting layer 253 is a light emitting layer that emits white light. Also, the light emitting layer 253 may include, for example, a red light emitting layer 253R, a blue light emitting layer 253B, and a green light emitting layer 253G in order on the hole transfer layer 252. A light emission separation layer 255 is provided between the red light emitting layer 253R and the blue light emitting layer 253B. In the display unit 2, such an organic layer 25 is shared by all of the organic light emitting elements 2A.

The hole injection layer 251, the hole transfer layer 252, and the electron transfer layer 254 may be made of materials similar to those of the hole injection layer 151, the hole transfer layer 152, and the electron transfer layer 154 in the organic light emitting element 1A, respectively. The electron transfer layer 254 has conductivity as with the electron transfer layer 154.

The red light emitting layer 253R generates red light resulting from recombination, in response to application of an electric field, of part of holes injected from the first electrode 12 via the hole injection layer 251 and the hole transfer layer 252 and part of electrons injected from the second electrode 16 via the electron transfer layer 254 and the light emission separation layer 255. Injection of the electrons to the red light emitting layer 253R via the light emission separation layer 255 reduces an amount of electrons supplied to the light emission separation layer 255. The red light emitting layer 253R may include, for example, one or more of a red light emitting material, a hole transfer material, an electron transfer material, and a both-charge transfer material. The red light emitting material may be fluorescent or may be phosphorescent. Examples of a material used as the red light emitting layer 253R may include 4,4-bis(2,2-diphenylvinyl)biphenyl (DPVBi) mixed with 30 wt % of 2,6-bis[(4'-methoxydiphenylamino)styryl]-1,5-dicyanonaphthalene (BSN). The light emission separation layer 255 may be made, for example, of 4,4'-bis[N-(1-naphthyl)-N-phenyl-amino]biphenyl represented by Formula (I) or the like.

(1)

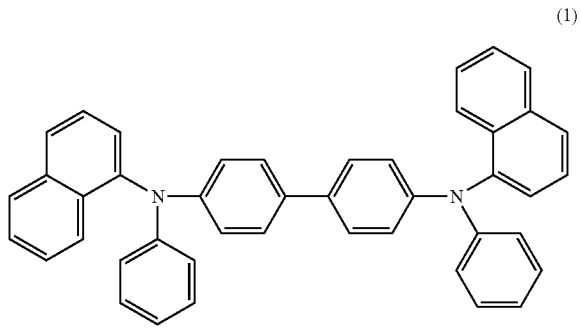 [SMILES: c1ccc(N(c2ccc(-c3ccc(N(c4ccccc4)c4cccc5ccccc45)cc3)cc2)c2cccc3ccccc23)cc1]

The blue light emitting layer 253B generates blue light resulting from recombination, in response to application of an electric field, of part of holes injected from the first electrode 12 via the hole injection layer 251, the hole transfer layer 252, and the light emission separation layer 255 and part of electrons injected from the second electrode 16 via the electron transfer layer 254. The blue light emitting layer 253B may include, for example, one or more of a blue light emitting material, a hole transfer material, an electron transfer material, and a both-charge transfer material. The blue light emitting material may be fluorescent or may be phosphorescent. Examples of a material used as the blue light emitting layer 253B may include DPVBi mixed with 2.5 wt % of 4,4'-bis[2-{4-(N,N-diphenylamino) phenyl}vinyl]biphenyl (DPAVBi).

The green light emitting layer 253G generates green light resulting from recombination of part of holes injected from the first electrode 12 via the hole injection layer 251, the hole transfer layer 252, and the light emission separation layer 255 and part of electrons injected from the second electrode 16 via the electron transfer layer 254. The green light emitting layer 253G may include, for example, one or more of a green light emitting material, a hole transfer material, an electron transfer material, and a both-charge transfer material. The green light emitting material may be fluorescent or may be phosphorescent. Examples of a material used as the green light emitting layer 253G may include DPVBi mixed with 5 wt % of Coumarin6.

At the opening S1 in the inter-pixel insulating film 14, such a light emitting layer 253 is provided to cover from the sidewall to a bottom surface of the opening S1 (the organic light emitting element 2A). In contrast, the light emitting layer 253 is separated near the opening S3 in the inter-pixel insulating film 14. By providing such an opening S3 that separates the light emitting layer 253, the organic layer 25 is allowed to be formed without using a deposition mask (the deposition mask M illustrated in FIG. 7B), which is described later in detail. It is to be noted that, in FIG. 12, and FIGS. 14, 17A, and 17B described later, illustration of the hole injection layer 251, the hole transfer layer 252, and the light emission separation layer 255 is omitted; however, the hole injection layer 251, the hole transfer layer 252, and the light emission separation layer 255 are formed in a region same as that of the light emitting layer 253.

Figure 14:
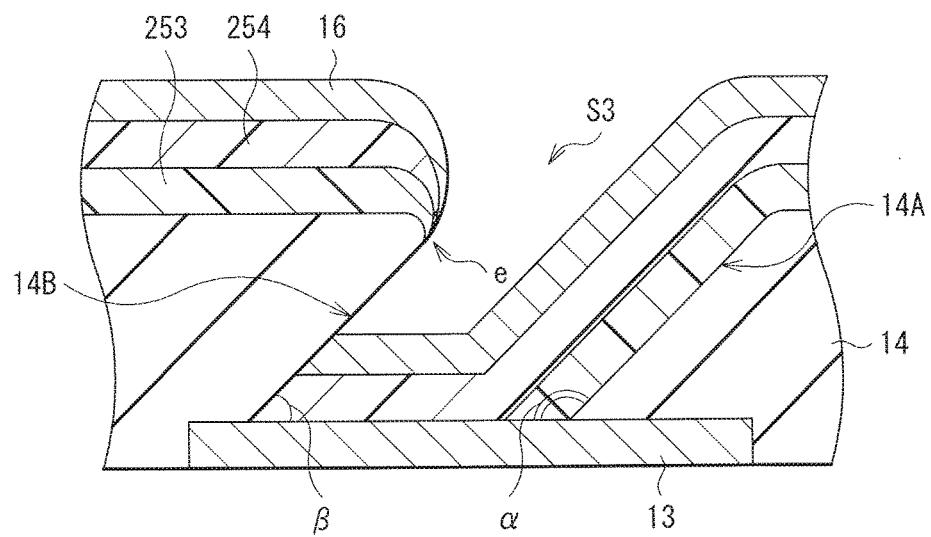
FIG. 14 is a cross-sectional view illustrating a configuration of an opening portion in an inter-pixel insulating film illustrated in FIG. 12.

FIG. 14 is a diagram of an enlarged part near the opening S3 in the inter-pixel insulating film 14. The sidewall of the opening S3 has the sloped surfaces 14A and 14B that face each other. The sloped surfaces 14A and 14B are each a surface that is non-parallel to the surface of the substrate 10a and is not perpendicular thereto. The sloped surface 14A (a second sloped surface) forms an angle α, with respect to the exposed surface of the auxiliary electrode 13, that is a blunt angle that is larger than 90° and smaller than 180° (90°<α<180°. The sloped surface 14B (a first sloped surface) forms an angle β, with respect to the exposed surface of the auxiliary electrode 13, that is an acute angle that is larger than 0° and smaller than 90° (0°<β<90°.

At the opening S3 that includes such sloped surfaces 14A and 14B in the sidewall thereof, the light emitting layer 253, the electron transfer layer 254, and the second electrode 16 are made discontinuous near an upper end e of the sloped surface 14B, and the light emitting layer 253, the electron transfer layer 254, and the second electrode 16 are not formed on the sloped surface 14B. At the upper end e, the electron transfer layer 254 and the second electrode 16 cover a discontinued surface of the light emitting layer 253. In other words, the inter-pixel insulating film 14 is exposed in the sloped surface 14B. On the other hand, the light emitting layer 253, the electron transfer layer 254, and the second electrode 16 are formed along the sloped surface 14A. The electron transfer layer 254 and the second electrode 16 out of the light emitting layer 253, the electron transfer layer 254, and the second electrode 16 on the sloped surface 14A extend onto the auxiliary electrode 13, and the electron transfer layer 254 is in contact with the auxiliary electrode 13. Thus, the second electrode 16 is electrically connected to the auxiliary electrode 13 via the electron transfer layer 254. The light emitting layer 253, the electron transfer layer 254, and the second electrode 16 on the sloped surface 14A extend to the adjacent opening S1, in the inter-pixel insulating film 14, that is in the opposite direction from the sloped surface 14B to configure the organic light emitting element 2A.

Such a display unit 2 may be manufactured as follows, for example (FIGS. 15A to 17B).

First, the first electrode 12 and the auxiliary electrode 13 are provided on the drive substrate 10 in a manner similar to that in the display unit 1, and thereafter, the inter-pixel insulating film 14 is formed. The inter-pixel insulating film 14 that has the sloped surfaces 14A and 14B on the sidewall of the opening S3 may be formed as follows, for example.

Figure 15A:
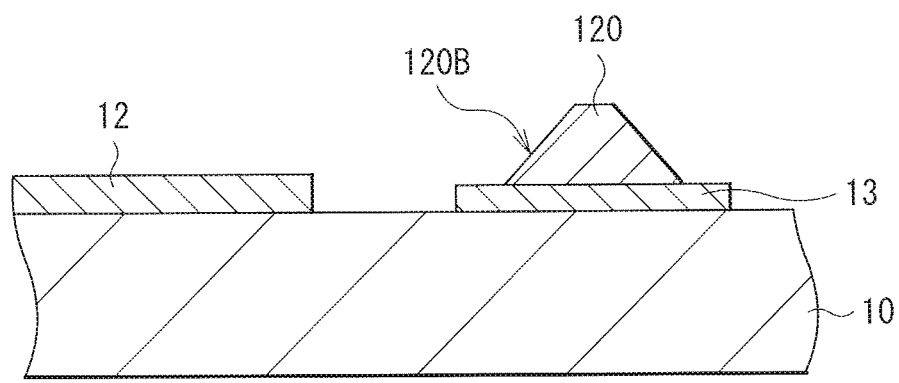
FIG. 15A is a cross-sectional view illustrating a manufacturing step of the display unit illustrated in FIG. 12.

First, as illustrated in FIG. 15A, a shaping thin film 120 is formed on the auxiliary electrode 13. The shaping thin film 120 is provided for forming the sloped surface 14B of the opening S3. The shaping thin film 120 may be formed, for example, as follows. For example, a metal film made of a material such as aluminum is formed on the entire surface of the drive substrate 10 by a sputtering method, and thereafter, patterning is performed to achieve a forward tapered shape by wet etching with the use of a photolithography method. Thus, the shaping thin film 120 that has a sloped surface 120B is selectively formed on the auxiliary electrode 13. A cross-section of the shaping thin film 120 is trapezoidal. The sloped surface 120B is formed so as to have a slope almost the same as that of the sloped surface 14B at a position almost the same as that of the sloped surface 14B.

Figure 15B:
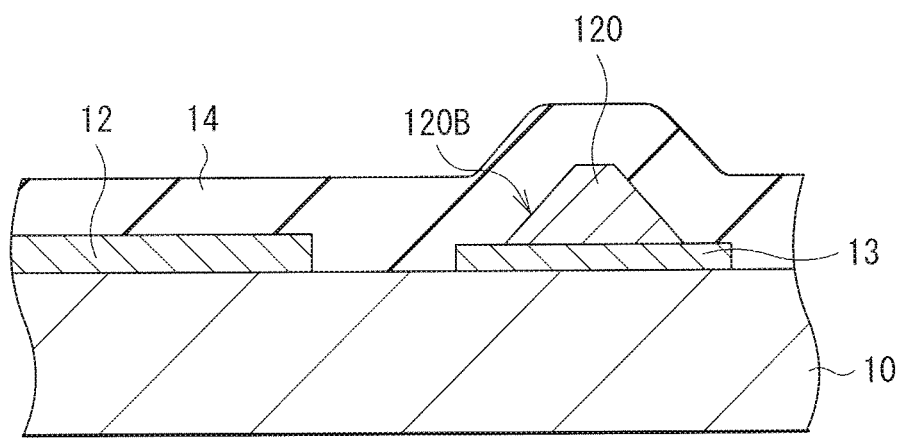
FIG. 15B is a cross-sectional view illustrating a step following the step illustrated in FIG. 15A.

After providing the shaping thin film 120, a material configuring the inter-pixel insulating film 14 may be deposited on the entire surface of the drive substrate 10, for example, by a spin coating method or a slit coating method, as illustrated in FIG. 15B. Subsequently, the openings S1 and S3 are formed in the inter-pixel insulating film 14.

Figure 16A:
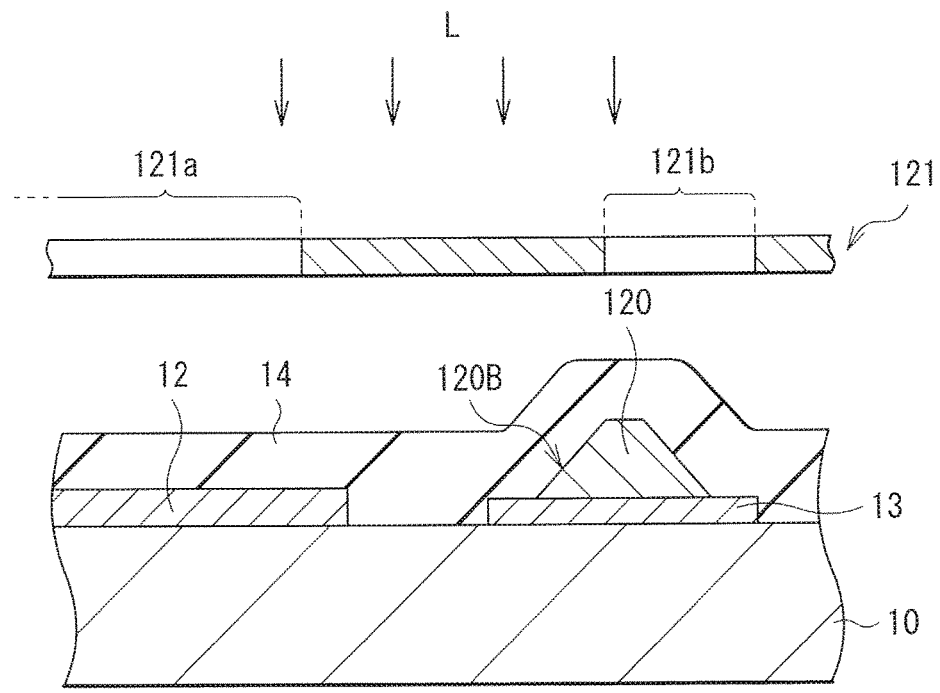
FIG. 16A is a cross-sectional view illustrating a step following the step illustrated in FIG. 15B.

Specifically, first, as illustrated in FIG. 16A, a selective region is exposed with the use of a photomask 121. At this time, a photomask that has an opening 121a in a region facing the first electrode 12 and has an opening 121b in a region facing part of the auxiliary electrode 13 is used as the photomask 121. The opening 121b may be arranged, for example, to be shifted from the sloped surface 120B of the shaping thin film 120. In other words, the opening 121b is arranged at a position that does not face the sloped surface 120B of the shaping thin film 120.

Subsequently, for example, development may be performed with the use of TMAH (Tetra-methyl-ammonium-hydroxide) aqueous solution as development solution. By using TMAH, it is possible to remove (lift off) the shaping thin film 120 made of metal by wet etching, at the same time as the development. At this time, for example, the first electrode 12 made of Al—Nd alloy may be preferable, because such a first electrode 12 has tolerance to TMAH, compared to the first electrode 12 configured of an Al single layer.

Figure 16B:
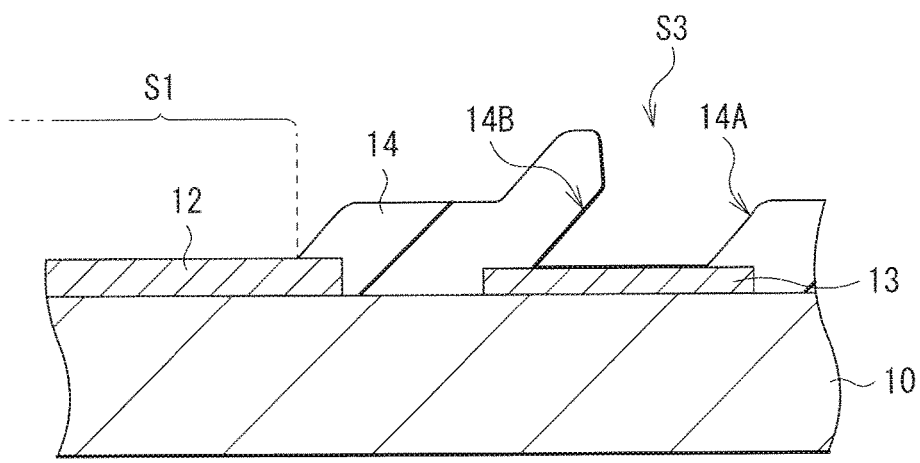
FIG. 16B is a cross-sectional view illustrating a step following the step illustrated in FIG. 16A.

After the development, washing with the use of rinse solution is performed, and the resultant is subsequently heated (post-baked). Thus, as illustrated in FIG. 16B, the opening S1 is formed in a region, of the inter-pixel insulating film 14, that faces the first electrode 12, and the opening S3 that has the sloped surfaces 14A and 14B on the sidewall thereof is formed in a region that faces the auxiliary electrode 13. The sloped surface 14A is formed with the use of a positive resist.

Figure 18:
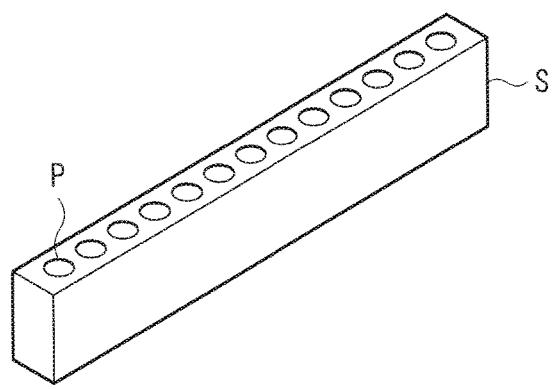
FIG. 18 is a perspective view illustrating a general configuration of a linear deposition source.

After providing the openings S1 and S3 in the inter-pixel insulating film 14, the organic layer 25 and the second electrode 16 may be formed in order, for example, by a line deposition method. The line deposition method is a method that uses a long linear deposition source S (FIG. 18). The linear deposition source S is provided with a plurality of pores P in a longitudinal direction. A deposition material is squirted out from the pores P to be deposited on a substrate.

Figure 19A:
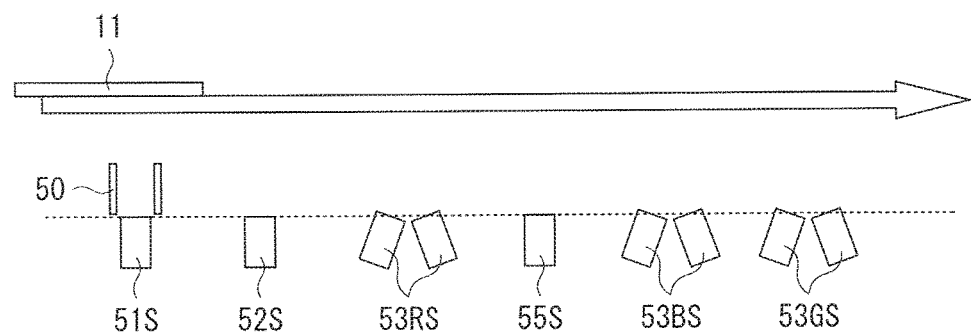
FIG. 19A is a schematic diagram illustrating an example of a method of forming the organic layer illustrated in FIG. 13.
Figure 19B:
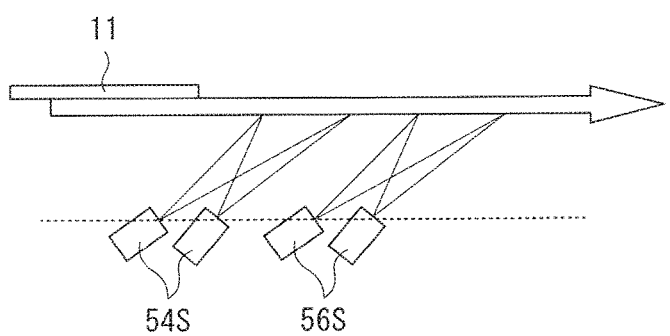
FIG. 19B is a schematic diagram illustrating a step following the step illustrated in FIG. 19A.

The organic layer 25 and the second electrode 16 may be formed as follows, for example. For example, as illustrated in FIGS. 19A and 19B, a material configuring the hole injection layer 251, a material configuring the hole transfer layer 252, a material configuring the red light emitting layer 253R, a material configuring the light emission separation layer 255, a material configuring the blue light emitting layer 253B, a material configuring the green light emitting layer 253G, a material configuring the electron transfer layer 254, and a material configuring the second electrode 16 are put in a first deposition source 51S, a second deposition source 52S, a third deposition source 53RS, a fourth deposition source 55S, a fifth deposition source 53BS, a sixth deposition source 53GS, a seventh deposition source 54S, and an eighth deposition source 56S, respectively, and the hole injection layer 251, the hole transfer layer 252, the red light emitting layer 253R, the light emission separation layer 255, the blue light emitting layer 253B, the green light emitting layer 253G, the electron transfer layer 254, and the second electrode 16 are formed in order. Specifically, the respective layers are formed by arranging the first deposition source 51S to the eighth deposition source 56S at predetermined positions, and relatively moving the arranged first deposition source 51S to the eighth deposition source 56S and the drive substrate 10. Limiting plates 50 are provided on both sides of the pore (the pore P illustrated in FIG. 18) of each of the first deposition source 51S to the eighth deposition source 56S. The limiting plates 50 define a width of the film to be deposited. In FIGS. 19A and 19B, illustration of the limiting plates for the second deposition source 52S to the eighth deposition source 56S is omitted. For example, for the first deposition source 51S, the second deposition source 52S, the third deposition source 53RS, the fourth deposition source 55S, the fifth deposition source 53BS, and the sixth deposition source 53GS, deposition may be performed in a state where each of the deposition sources (a surface, of the deposition source, that has a pore) faces the drive substrate 10 in parallel, and for the seventh deposition source 54S and the eighth deposition source 56S, deposition may be performed from an oblique direction with respect to the drive substrate 10. In other words, the electron transfer layer 254 and the second electrode 16 are formed by an oblique line deposition method. The oblique line deposition method may be performed in a state where the deposition sources (the seventh deposition source 54S and the eighth deposition source 56S) are inclined with respect to the drive substrate 10, or may be performed in a state where the drive substrate 10 is inclined with respect to the deposition sources.

Figure 17A:
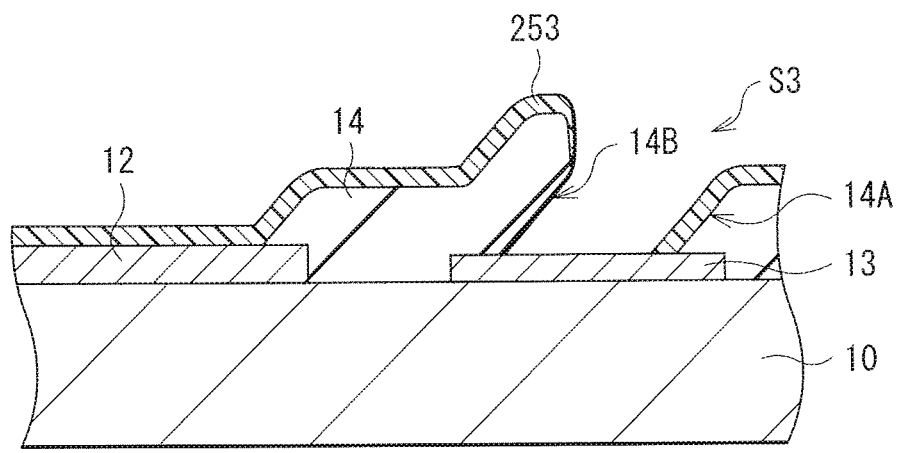
FIG. 17A is a cross-sectional view illustrating a step following the step illustrated in FIG. 16B.
Figure 17B:
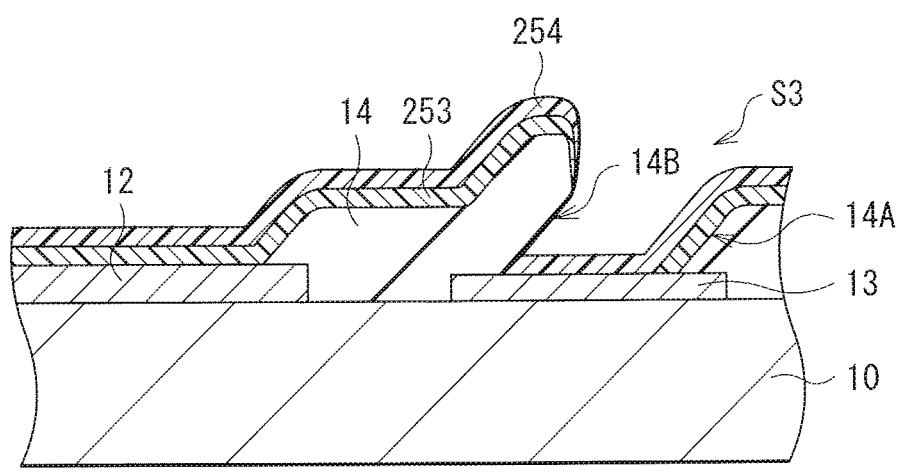
FIG. 17B is a cross-sectional view illustrating a step following the step illustrated in FIG. 17A.

By thus using the line deposition method, the organic layer 25 and the second electrode 16 that are shared by all of the organic light emitting elements 2A are formed. In the present embodiment, the sidewall of the opening S3 in the inter-pixel insulating film 14 has the sloped surface 14B that forms the acute angle β with respect to the surface of the auxiliary electrode 13, and the organic layer 25 is therefore made discontinuous near the upper end e of the opening S3 (FIGS. 17A and 17B). One reason for this is because the materials configuring the organic layer 25 are not deposited on the sloped surface 14B that is sloped in a direction narrowing the opening S3 with respect to the deposition sources in the deposition method having low coverage.

On the other hand, the organic layer 25 is formed along the sloped surface 14A that is sloped in a direction widening the opening S3 with respect to the deposition source. However, out of the organic layer 25, the layers (the hole injection layer 251, the hole transfer layer 252, the light emitting layer 253, and the light emission separation layer 255) that are formed in the state where the deposition sources are arranged in parallel to the drive substrate 10 are not formed on the auxiliary electrode 13, because the deposition materials thereof are not allowed to extend from the sloped surface 14A into the bottom surface of the opening S3 (the surface of the auxiliary electrode 13) (FIG. 17A).

In contrast, the electron transfer layer 254 and the second electrode 16 that are formed by an oblique line deposition method are formed on the auxiliary electrode 13, because the deposition materials thereof also extend into the bottom surface of the opening S3 (FIG. 17B).

After providing the second electrode 16, the protection layer 17 is formed in a manner similar to that in the display unit 1. Lastly, the drive substrate 10 is attached to the sealing substrate 20 with the use of an adhesive layer to complete the display unit 2.

In the display unit 2, the sloped surface 14B is provided on the sidewall of the opening S3 in the inter-pixel insulating film 14, and the organic layer 25 (the hole injection layer 251, the hole transfer layer 252, the light emitting layer 253, and the light emission separation layer 255) except for the electron transfer layer 254 is therefore allowed to be formed without using a deposition mask (the deposition mask M illustrated in FIG. 7B). As a result, it is possible to improve yield. This is described below.

When the non-conductive organic layer is attached onto the auxiliary electrode, electric connection between the auxiliary electrode and the second electrode is not allowed to be secured. Accordingly, there is known a method of forming the organic layer in a selective region with the use of the deposition mask to prevent the organic material from being attached onto the auxiliary electrode. However, in such a method using the deposition mask, position alignment between the deposition mask and the drive substrate is necessary, and high accuracy is demanded for such position alignment. Further, a foreign substance may be mixed inside the display unit due to the deposition mask. For such reasons, it has been difficult to improve yield in the method of forming the organic layer with the use of the deposition mask.

In contrast, in the display unit 2, the sloped surface 14B is provided on the sidewall of the opening S3 in the inter-pixel insulating film 14. The organic layer 25 is thereby made discontinuous near the upper end e of the opening S3. Out of the organic layer 25, layers that are formed in the state where the deposition sources are arranged in parallel to the drive substrate 10 are not formed on the bottom surface of the opening S3 either (the hole injection layer 251, the hole transfer layer 252, the light emitting layer 253, and the light emission separation layer 255). In other words, by adjusting a deposition direction, the organic layer 25 except for the electron transfer layer 254 is not formed on the auxiliary electrode 13. Accordingly, it is possible to prevent the organic layer 25 except for the electron transfer layer 254 from being attached to the auxiliary electrode 13 without using the deposition mask. As a result, yield is improved.

Moreover, when using the deposition mask, it is difficult to achieve higher resolution in pixels because of an issue of accuracy in position alignment. However, the display unit 2 is allowed to achieve higher resolution, because the display unit 2 is allowed to be manufactured without using the deposition mask. In addition thereto, the display unit 2 is allowed to achieve increase in size of the substrate.

Moreover, the second electrode 16 may be made discontinuous between the bottom surface of the opening S3 to the sloped surface 14A. However, the conductive electron transfer layer 254 covers, together with the second electrode 16, from the bottom surface of the opening S3 to the sloped surface 14A. The electric connection between the auxiliary electrode 13 and the second electrode 16 is therefore maintained due to the electron transfer layer 254 even if part of the second electrode 16 is made discontinuous. Accordingly, it is possible to improve stability of the electric connection between the auxiliary electrode 13 and the second electrode 16.

Third Embodiment

Figure 20:
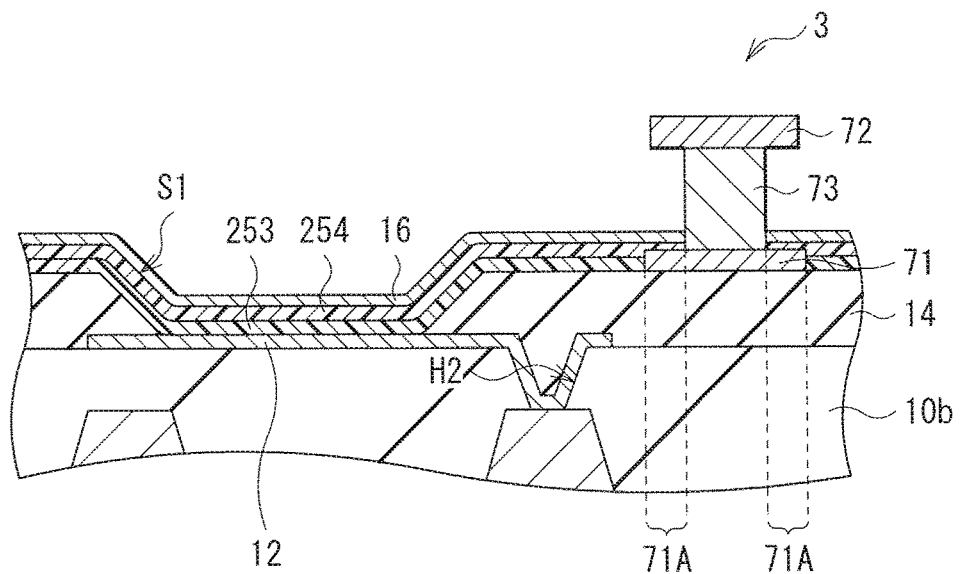
FIG. 20 is a cross-sectional view illustrating a configuration of a main part of a display unit according to a third embodiment of the present technology.

FIG. 20 illustrates a cross-sectional configuration of a main part of a display unit (a display unit 3) according to a third embodiment of the present technology. An auxiliary electrode 71 in the display unit 3 is covered with a shielding member 72. Except for this, the display unit 3 has a configuration similar to that of the display unit 1, and has functions and effects similar to those of the display unit 1.

The auxiliary electrode 71 may be provided, for example, on the inter-pixel insulating film 14 in contact therewith. The shielding member 72 is provided away from the auxiliary electrode 71, and covers part or all of the auxiliary electrode 71. The shielding member 72 may have, for example, a planar shape that is almost the same as that of the auxiliary electrode 71, and may cover all of the auxiliary electrode 71. A columnar member 73 is provided between the auxiliary electrode 71 and the shielding member 72, and separates the auxiliary electrode 71 away from the shielding member 72. The auxiliary electrode 71 may be provided at an opening in the inter-pixel insulating film 14.

The auxiliary electrode 71 is provided with a portion (a connection portion 71A) with which the electron transfer layer 254 is in contact. By forming the electron transfer layer 254 and the second electrode 16 on the connection portion 71A, the auxiliary electrode 71 is electrically connected to the second electrode 16 via the electron transfer layer 254.

The connection portion 71A is a region, of the auxiliary electrode 71, that has a width larger than that of the columnar member 73 and is covered with the shielding member 72. The organic layer 25 having low coverage is less likely to be formed on such a connection section 71A. By obliquely depositing the electron transfer layer 254 and the second electrode 16 in a manner similar to that described above in the second embodiment, the electron transfer layer 254 and the second electrode 16 are formed also on the connection portion 71A. The auxiliary electrode 71 may be made, for example, of a material similar to that of the auxiliary electrode 13 in the display unit 1 described above.

The area of the planar shape of the shielding member 72 may be preferably equal to or smaller than the area of the planar shape of the auxiliary electrode 71. One reason for this is because the electron transfer layer 254 may become difficult to be formed on the connection portion 71A when the area of the planar shape of the shielding member 72 is larger than the area of the planar shape of the auxiliary electrode 71. Such shielding member 72 and columnar member 73 may be preferably made of a low-resistance metal material. For example, when the auxiliary electrode 71 is made of titanium (Ti), the columnar member 73 may be made of aluminum (Al), and the shielding member 72 may be made of titanium. These metal films may be formed in order, for example, by a sputtering method, and the formed metal films may be patterned by a photolithography method to form the auxiliary electrode 71 and the shielding member 72. The columnar member 73 that has a smaller width than the auxiliary electrode 71 and the shielding member 72 may be formed, for example, by performing selective etching with the use of weakly-alkaline solution or the like after patterning the auxiliary electrode 71 and the shielding member 72.

The organic layer 25 in the display unit 3 has a configuration similar to that of the organic layer 25 (the organic layer 25 illustrated in FIG. 13) in the display unit 2 described above. The organic layer 25 in the display unit 3 is shared by all of the organic light emitting elements 3A. The organic layer 25 except for the electron transfer layer 254 is made discontinuous near an end of the auxiliary electrode 71. On the other hand, the conductive electron transfer layer 254 is continuously provided from the opening S1 portion of the inter-pixel insulating film 14 to the connection portion 71A of the auxiliary electrode 71. As described above, the organic layer 25 having low coverage is not formed on the connection portion 71A of the auxiliary electrode 71 due to a shadowing effect of the shielding member 72. However, it is made possible to form the electron transfer layer 254 on the connection portion 71A by forming the electron transfer layer 254 by oblique deposition. The organic layer 25 except for the electron transfer layer 254 may be formed on the auxiliary electrode 71. In this case, the electron transfer layer 254 covers end surfaces of other layers in the organic layer 25, and is in contact with the auxiliary electrode 71.

By thus providing the shielding member 72, the organic layer 25 except for the electron transfer layer 254 is made discontinuous near the end of the auxiliary electrode 71. Accordingly, it is possible to prevent the organic layer 25 except for the electron transfer layer 254 from being attached to the auxiliary electrode 71 without using the deposition mask. As a result, yield is improved as in the second embodiment described above. Further, it is also possible to achieve higher resolution.

APPLICATION EXAMPLES

Description is provided below of application examples of the display unit 1 as described above to electronic apparatuses. Examples of the electronic apparatus may include a television apparatus, a digital camera, a notebook personal computer, a mobile terminal apparatus such as a mobile phone, and a video camcorder. In other words, the above-described display unit is applicable to an electronic apparatus in any field that displays a picture signal inputted from outside or a picture signal generated inside as an image or a picture.

[Module]

Figure 21:
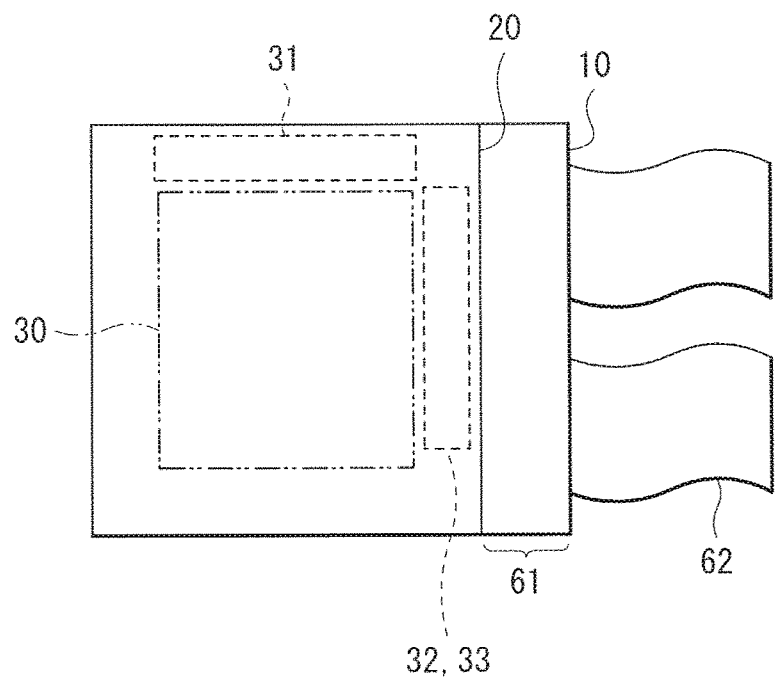
FIG. 21 is a planar view illustrating a schematic configuration of a module that includes the display unit illustrated in FIG. 1.

The above-described display unit 1 may be assembled in various electronic apparatuses such as Application examples 1 to 7 described above, for example, as a module as illustrated in FIG. 21. In the module, for example, a region 61, exposed from the sealing substrate 20 or the drive substrate 10, may be provided on one side of the drive substrate 10 or the sealing substrate 20, and wirings of the horizontal selector (HSEL) 31, the power scanner (DSCN) 33, and the write scanner (WSCN) 32 are extended to form an external connection terminal in the exposed region 61. The external connection terminal may be provided with a flexible printed circuit (FPC) 62 for inputting and outputting a signal.

Application Example 1

Figure 22A:
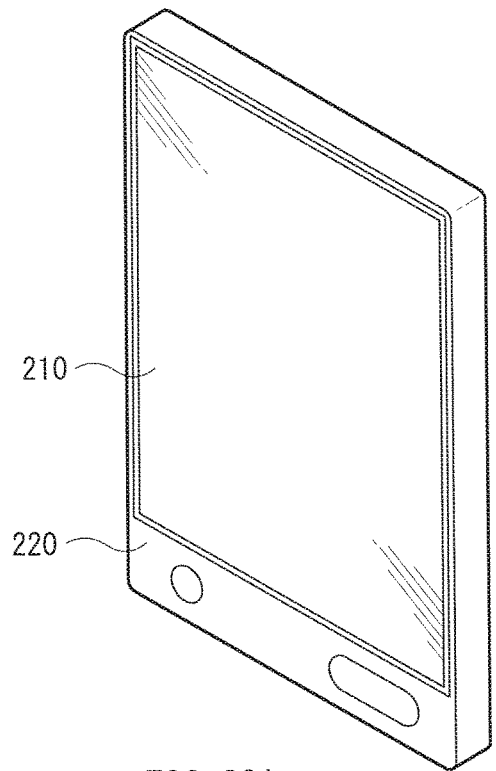
FIG. 22A is a perspective view illustrating an appearance of Application example 1.
Figure 22B:
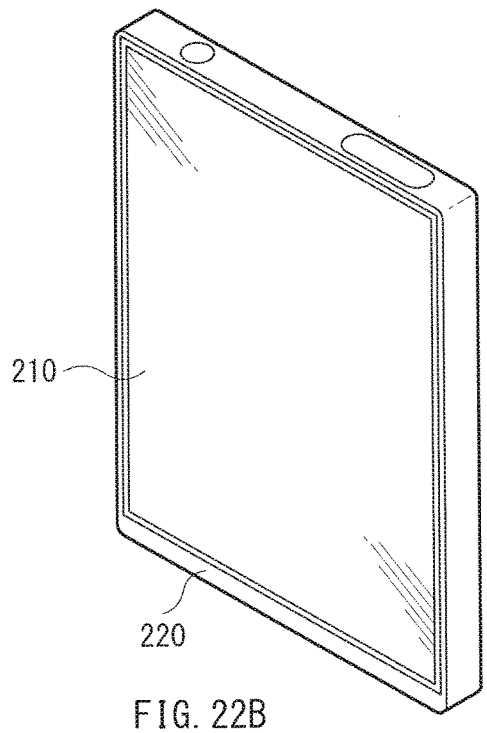
FIG. 22B is another perspective view illustrating an appearance of Application example 1.

FIGS. 22A and 22B each illustrate an appearance of an electronic book to which the display unit (any of the display units 1, 2, and 3) of the above-described embodiment is applied. The electronic book may include, for example, a display section 210 and a non-display section 220. The display section 210 is configured of the display unit of the above-described embodiment.

Application Example 2

Figure 23:
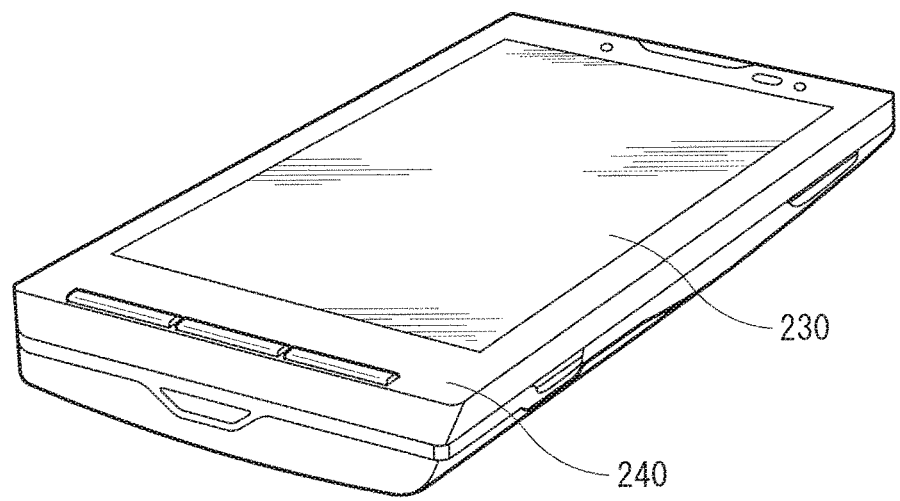
FIG. 23 is a perspective view illustrating an appearance of Application example 2.

FIG. 23 illustrates an appearance of a smartphone to which the display unit of the above-described embodiment is applied. The smartphone may include, for example, a display section 230 and a non-display section 240. The display section 230 is configured of the display unit of the above-described embodiment.

Application Example 3

Figure 24:
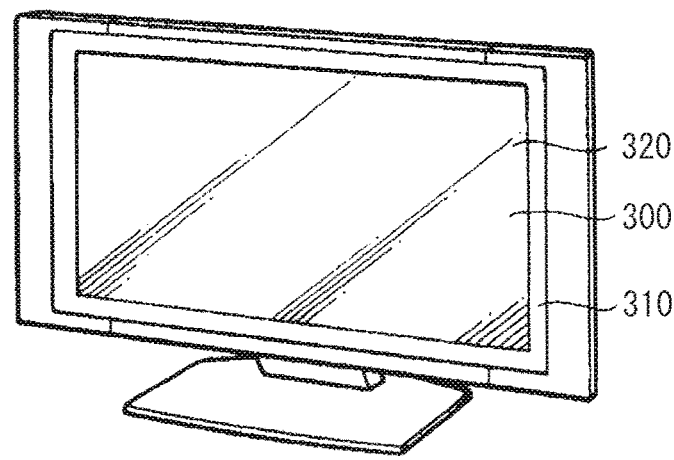
FIG. 24 is a perspective view illustrating an appearance of Application example 3.

FIG. 24 illustrates an appearance of a television apparatus to which the display unit of the above-described embodiment is applied. The television apparatus may include, for example, a picture display screen section 300 that includes a front panel 310 and a filter glass 320. The picture display screen section 300 is configured of the display unit of the above-described embodiment.

Application Example 4

Figure 25A:
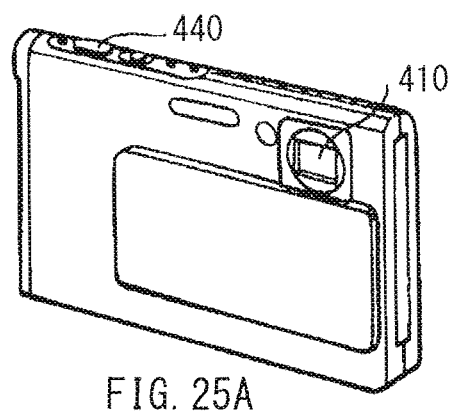
FIG. 25A is a perspective view illustrating an appearance of Application example 4 seen from the front.
Figure 25B:
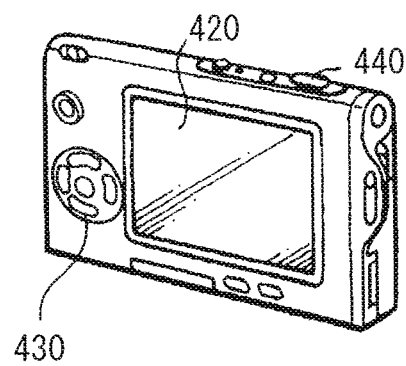
FIG. 25B is a perspective view illustrating the appearance of Application example 4 seen from the back.

FIGS. 25A and 25B each illustrate an appearance of a digital camera to which the display unit of the above-described embodiment is applied. The digital camera may include, for example, a light emission section 410 for a flash, a display section 420, a menu switch 430, and a shutter button 440. The display section 420 is configured of the display unit of the above-described embodiment.

Application Example 5

Figure 26:
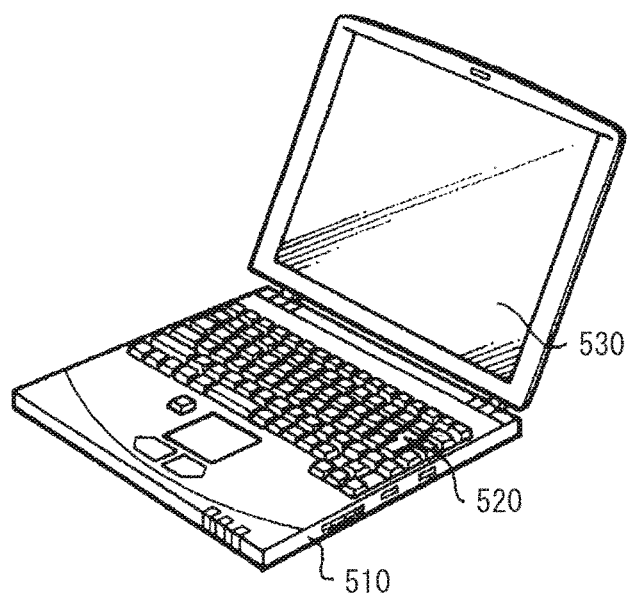
FIG. 26 is a perspective view illustrating an appearance of Application example 5.

FIG. 26 illustrates an appearance of a notebook personal computer to which the display unit of the above-described embodiment is applied. The notebook personal computer may include, for example, a main body 510, a keyboard 520 for input operation of letters and the like, and a display section 530 that displays an image. The display section 530 is configured of the display unit of the above-described embodiment.

Application Example 6

Figure 27:
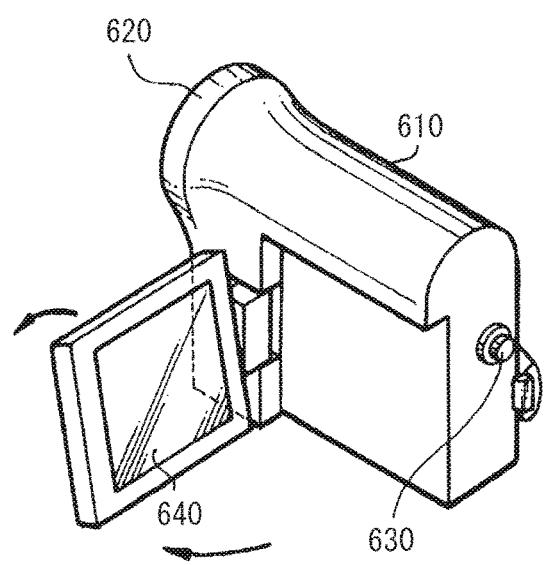
FIG. 27 is a perspective view illustrating an appearance of Application example 6.

FIG. 27 illustrates an appearance of a video camcorder to which the display unit of the above-described embodiment is applied. The video camcorder may include, for example, a main body section 610, a lens 620 for shooting a subject provided on a forward side face of the main body section 610, a start-stop switch 630 used at the time of shooting, and a display unit 640. The display unit 640 is configured of the display unit of the above-described embodiment.

Application Example 7

Figure 28A:
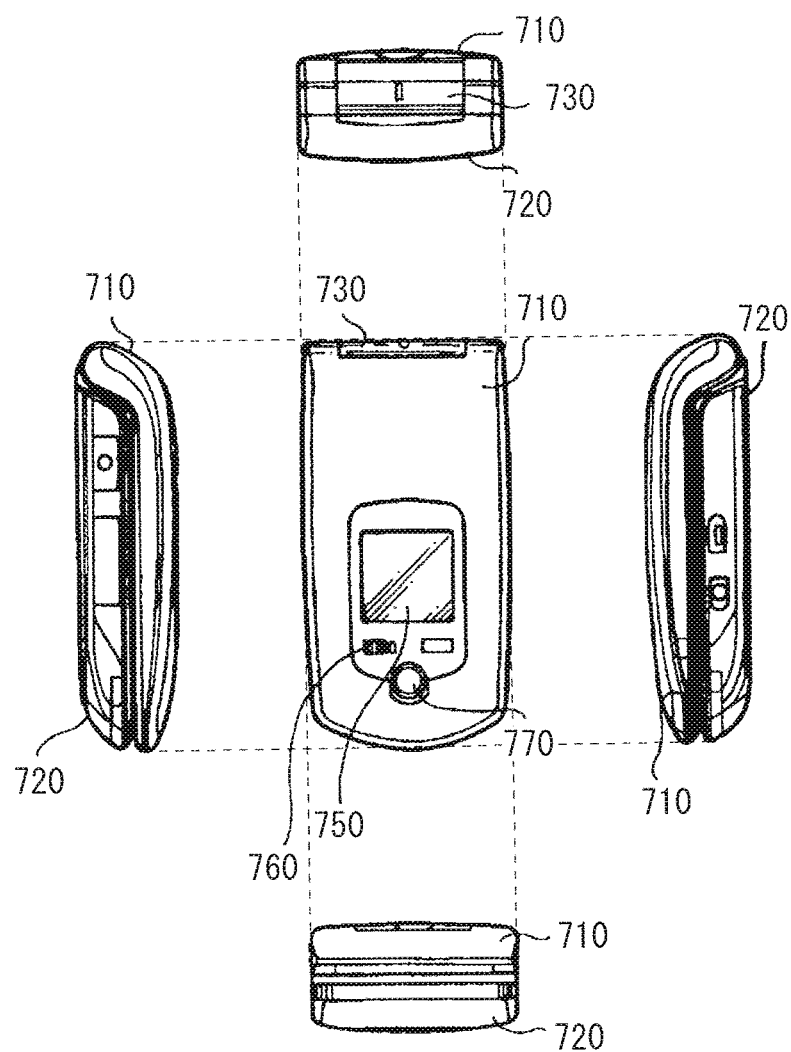
FIG. 28A is a diagram illustrating a closed state of Application example 7.
Figure 28B:
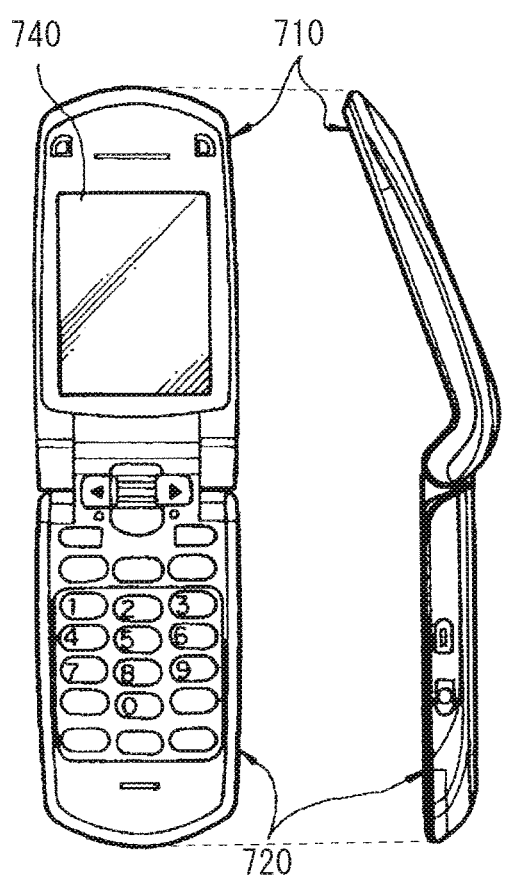
FIG. 28B is a diagram illustrating an open state of Application example 7.

FIGS. 28A and 28B each illustrate an appearance of a mobile phone to which the display unit of the above-described embodiment is applied. The mobile phone may include, for example, a top housing 710, a bottom housing 720, and a linking section (a hinge section) 730 linking the top housing 710 and the bottom housing 720. The mobile phone may further include a display 740, a sub-display 750, a picture light 760, and a camera 770. The display 740 or the sub-display 750 out of these components is configured of the display unit of the above-described embodiment.

Figure 29A:
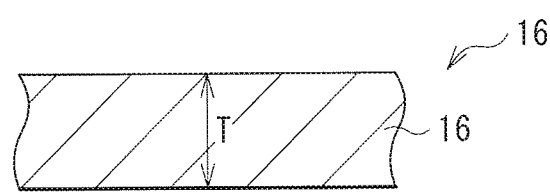
FIG. 29A is a cross-sectional view for explaining about the second electrode illustrated in FIG. 1, etc.
Figure 29B:
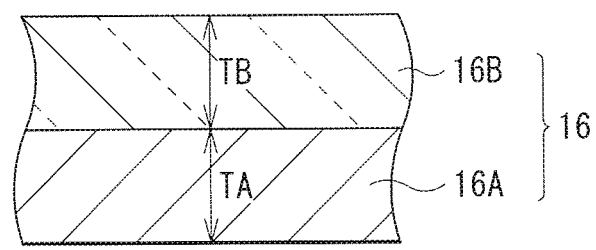
FIG. 29B is a cross-sectional view for illustrating another example of the second electrode illustrated in FIG. 1, etc.

The present technology has been described above referring to some embodiments thereof. However, the present technology is not limited to the above-described embodiments, and various modifications may be made. For example, the second electrode 16 may be configured of a laminated film. The second electrode 16 (FIG. 29B) may be configured by laminating a conductive film 16B having high light transmission characteristics on a conductive film 16A having a thickness TA. In this case, for example, a thickness TB of the conductive film 16B may be adjusted so that a sheet resistance value of the second electrode 16 configured of the conductive films 16A and 16B becomes the same as a sheet resistance value of the second electrode 16 (FIG. 29A) that is configured of a single layer and has a thickness T. Thus, it is possible to achieve higher light transmission characteristics in the second electrode 16 (FIG. 29B) configured of the laminated film, compared to the second electrode 16 (FIG. 29A) configured of the single layer.

Moreover, in the above-described embodiments, the method of forming the second electrode 16 has been described referring to oblique deposition as an example; however, the second electrode 16 may be formed by a sputtering method.

Moreover, in the above-described embodiments, description has been provided of the top-emission-type display unit; however, the present technology is also applicable to a bottom-emission-type display unit.

Moreover, in the above-described embodiments and the like, description has been provided of the active-matrix-type display unit; however, the present technology is also applicable to a passive-matrix-type display unit. Further, the configuration of the pixel drive circuit for achieving active matrix drive is not limited to that described in the above embodiments, and may additionally include a capacitor, a transistor, etc. as necessary.

Moreover, the material and the thickness, the forming method and the forming condition, etc. of each of the layers described in the above embodiments are not limitative, and other material and thickness or other forming method and forming condition may be used.

It is to be noted that the effects described herein are mere examples. The effects of the present technology are not limited thereto and may include other effect.

It is possible to achieve at least the following configurations from the above-described example embodiments and the modifications of the present technology.

(1) A display unit including:
an organic light emitting element including a first electrode, an organic layer, and a second electrode in order, the organic layer including a conductive layer; and
an auxiliary electrode configured to be electrically connected to the second electrode via the conductive layer in the organic layer.

(2) The display unit according to (1), including
a plurality of the organic light emitting elements, wherein
the conductive layer and the second electrode are shared by the plurality of organic light emitting elements.

(3) The display unit according to (1) or (2), wherein the conductive layer includes one of alkali metal and alkaline-earth metal in an organic material.

(4) The display unit according to (2), wherein
the organic layer further includes a light emitting layer, and
the conductive layer is an electron transfer layer between the light emitting layer and the second electrode.

(5) The display unit according to (4), further including
an insulating film between the first electrode and the organic layer, the insulating film including a first opening and a second opening, the first opening causing a surface of the first electrode to be exposed therefrom, and the second opening causing a surface of the auxiliary electrode to be exposed therefrom.

(6) The display unit according to (5), wherein
the first opening has a size increasing in a direction from the first electrode toward the second electrode, and
the second opening has a sidewall perpendicular to the surface of the auxiliary electrode.

(7) The display unit according to (5), wherein the light emitting layer is provided for each of the plurality of organic light emitting elements.

(8) The display unit according to (5), wherein the second opening has a sidewall including a first sloped surface and a second sloped surface, the first sloped surface forming an acute angle with respect to the exposed surface of the auxiliary electrode, and the second sloped surface facing the first sloped surface and forming a blunt angle with respect to the exposed surface of the auxiliary electrode.

(9) The display unit according to (8), wherein the light emitting layer is shared by the plurality of organic light emitting elements.

(10) The display unit according to (9), wherein the light emitting layer is made discontinuous at an upper end of the first sloped surface of the second opening.

(11) The display unit according to (10), wherein the electron transfer layer is continuously provided from the surface, of the auxiliary electrode, exposed from the second opening to the first opening adjacent to the second opening via the second sloped surface.

(12) The display unit according to any one of (1) to (11), wherein the conductive layer is in contact with the second electrode between the first electrode and the second electrode.

(13) The display unit according to any one of (1) to (5), further including a shielding member provided away from the auxiliary electrode and covering part or all of the auxiliary electrode.

(14) The display unit according to (13), further including a columnar member between the shielding member and the auxiliary electrode.

(15) The display unit according to (13) or (14), wherein a part, of the auxiliary electrode, covered by the shielding member is in contact with the conductive layer.

(16) A method of manufacturing a display unit, the method including:
forming an auxiliary electrode and forming an organic light emitting element away from the auxiliary electrode, the organic light emitting element being provided with a first electrode, an organic layer, and a second electrode in order, and the organic layer including a conductive layer; and
electrically connecting the second electrode to the auxiliary electrode via the conductive layer in the organic layer.

(17) The method according to (16), wherein
the auxiliary electrode and the organic light emitting element are formed on a substrate, and
the conductive layer and the second electrode are formed by performing oblique deposition with respect to the substrate.

(18) An electronic apparatus provided with a display unit, the display unit including:
an organic light emitting element including a first electrode, an organic layer, and a second electrode in order, the organic layer including a conductive layer; and
an auxiliary electrode configured to be electrically connected to the second electrode via the conductive layer in the organic layer.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a plurality of pixels respectively including an organic light emitting element having a first electrode, an organic layer, and a second electrode in order, the organic layer including a conductive layer;
an auxiliary electrode in direct contact with the conductive layer and electrically connected to the second electrode via the conductive layer; and
an insulating film on the first electrode between the first electrode and the organic layer and on the auxiliary electrode between the auxiliary electrode and the organic layer,
wherein the conductive layer is in contact with the second electrode between the first electrode and the second electrode, and
wherein the insulating film includes a first opening and a second opening, the first opening causing a surface of the first electrode to be exposed therefrom, and the second opening disposed between adjacent pixels of the plurality of pixels and causing a surface of the auxiliary electrode to be exposed therefrom.

2. The display unit according to claim 1, wherein
the conductive layer and the second electrode are shared by the plurality of organic light emitting elements.

3. The display unit according to claim 1, wherein the conductive layer includes one of alkali metal and alkaline-earth metal in an organic material.

4. The display unit according to claim 2, wherein
the organic layer further includes a light emitting layer, and
the conductive layer is an electron transfer layer between the light emitting layer and the second electrode.

5. The display unit according to claim 4, wherein the light emitting layer is provided for each of the plurality of organic light emitting elements.

6. The display unit according to claim 4, wherein the light emitting layer is not provided in a vicinity of the auxiliary electrode.

7. The display unit according to claim 1, wherein
the first opening has a size increasing in a direction from the first electrode toward the second electrode, and
the second opening has a sidewall perpendicular to the surface of the auxiliary electrode.

8. The display unit according to claim 1, wherein the second opening has a sidewall including a first sloped surface and a second sloped surface, the first sloped surface forming an acute angle with respect to the exposed surface of the auxiliary electrode, and the second sloped surface facing the first sloped surface and forming a blunt angle with respect to the exposed surface of the auxiliary electrode.

9. The display unit according to claim 8, wherein the light emitting layer is shared by the plurality of organic light emitting elements.

10. The display unit according to claim 9, wherein the light emitting layer is made discontinuous at an upper end of the first sloped surface of the second opening.

11. The display unit according to claim 10, wherein the electron transfer layer is continuously provided from the surface, of the auxiliary electrode, exposed from the second opening to the first opening adjacent to the second opening via the second sloped surface.

12. The display unit according to claim 1, further comprising a shielding member provided away from the auxiliary electrode and covering part or all of the auxiliary electrode.

13. The display unit according to claim 12, further comprising a columnar member between the shielding member and the auxiliary electrode.

14. The display unit according to claim 12, wherein a part, of the auxiliary electrode, covered by the shielding member is in contact with the conductive layer.

15. The display unit according to claim 1, wherein the organic layer further includes a hole injection layer, a hole transfer layer, and a light emitting layer between the conductive layer and the first electrode.

16. A method of manufacturing a display unit, the method comprising:
forming an auxiliary electrode and forming a plurality of pixels respectively including an organic light emitting element away from the auxiliary electrode, the organic light emitting element being provided with a first electrode, an organic layer, and a second electrode in order, and the organic layer including a conductive layer in direct contact with the auxiliary electrode;
forming an insulating film on the first electrode between the first electrode and the organic layer and on the auxiliary electrode between the auxiliary electrode and the organic layer; and
electrically connecting the second electrode to the auxiliary electrode via the conductive layer,
wherein the conductive layer is in contact with the second electrode between the first electrode and the second electrode, and
wherein the insulating film includes a first opening and a second opening, the first opening causing a surface of the first electrode to be exposed therefrom, and the second opening disposed between adjacent pixels of the plurality of pixels and causing a surface of the auxiliary electrode to be exposed therefrom.

17. The method according to claim 16, wherein
the auxiliary electrode and the organic light emitting element are formed on a substrate, and
the conductive layer and the second electrode are formed by performing oblique deposition with respect to the substrate.

18. An electronic apparatus provided with a display unit, the display unit comprising:
a plurality of pixels respectively including an organic light emitting element having a first electrode, an organic layer, and a second electrode in order, the organic layer including a conductive layer;
an auxiliary electrode in direct contact with the conductive layer and electrically connected to the second electrode via the conductive layer; and
an insulating film on the first electrode between the first electrode and the organic layer and on the auxiliary electrode between the auxiliary electrode and the organic layer,
wherein the conductive layer is in contact with the second electrode between the first electrode and the second electrode, and
wherein the insulating film includes a first opening and a second opening, the first opening causing a surface of the first electrode to be exposed therefrom, and the second opening disposed between adjacent pixels of the plurality of pixels and causing a surface of the auxiliary electrode to be exposed therefrom.

* * * * *